US008817376B2

(12) United States Patent
Lee et al.

(10) Patent No.: US 8,817,376 B2
(45) Date of Patent: *Aug. 26, 2014

(54) OPTICAL COATING METHOD, APPARATUS AND PRODUCT

(71) Applicant: Corning Incorporated, Corning, NY (US)

(72) Inventors: Christopher Morton Lee, Corning, NY (US); Xiao-feng Lu, Jiangmen (CN); Michael Xu Ouyang, Painted Post, NY (US); Junhong Zhang, Fuzhou (CN)

(73) Assignee: Corning Incorporated, Corning, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/022,792

(22) Filed: Sep. 10, 2013

(65) Prior Publication Data

US 2014/0016201 A1 Jan. 16, 2014

Related U.S. Application Data

(63) Continuation of application No. 13/690,829, filed on Nov. 30, 2012.
(Continued)

(51) Int. Cl.
| | |
|---|---|
| *G02B 1/10* | (2006.01) |
| *C03C 17/00* | (2006.01) |
| *C23C 14/04* | (2006.01) |
| *C23C 14/56* | (2006.01) |
| *C03C 17/42* | (2006.01) |
| *B05D 5/06* | (2006.01) |
| *C23C 14/24* | (2006.01) |
| *G02B 1/11* | (2006.01) |
| *B05C 13/00* | (2006.01) |
| *C23C 14/50* | (2006.01) |
| *C23C 14/12* | (2006.01) |

(52) U.S. Cl.
CPC ............... *G02B 1/11* (2013.01); *C03C 17/002* (2013.01); *C23C 14/044* (2013.01); *C23C 14/56* (2013.01); *C03C 17/42* (2013.01); *B05D 5/061* (2013.01); *C03C 2218/151* (2013.01); *C23C 14/24* (2013.01); *C03C 2217/734* (2013.01); *B05C 13/00* (2013.01); *C03C 2217/76* (2013.01); *C03C 2218/32* (2013.01); *C23C 14/505* (2013.01); *C23C 14/12* (2013.01); *C03C 2217/78* (2013.01)
USPC .......................................................... 359/588

(58) Field of Classification Search
USPC ......... 359/577, 580, 581, 586, 588, 601–603, 359/642, 722, 723, 738; 351/159.01, 351/159.49, 159.55, 159.57, 159.6, 159.62, 351/159.63, 159.64, 159.65, 159.73
See application file for complete search history.

(56) References Cited

U.S. PATENT DOCUMENTS

| 2,338,234 A | 1/1994 | Dimmick | 117/106 |
| 5,352,294 A | 10/1994 | White et al. | 118/725 |

(Continued)

FOREIGN PATENT DOCUMENTS

| EP | 614957 A1 | 9/1994 | B29D 11/00 |
| EP | 1 136 973 | 9/2001 | |

(Continued)

OTHER PUBLICATIONS

Martinet et al; "Deposition of SiO2 and TiO2 Thin Films by Plasma Enchanced Chemical Vapor Deposition for Antireflection Coating"; Journal of Non-Crystalling Solids 216 (1997) 77-82.
(Continued)

*Primary Examiner* — Stephone B Allen
*Assistant Examiner* — Kimberly N Kakalec
(74) *Attorney, Agent, or Firm* — Tim Schaeberle; Payal A. Patel

(57) ABSTRACT

This disclosure is directed to an improved process for making glass articles having optical coating and easy-to clean coating thereon, an apparatus for the process and a product made using the process. In particular, the disclosure is directed to a process in which the application of the optical coating and the easy-to-clean coating can be sequentially applied using a single apparatus. Using the combination of the coating apparatus and the substrate carrier described herein results in a glass article having both optical and easy-to-clean coating that have improved scratch resistance durability and optical performance, and in addition the resulting articles are "shadow free."

13 Claims, 16 Drawing Sheets

Related U.S. Application Data

(60) Provisional application No. 61/565,024, filed on Nov. 30, 2011, provisional application No. 61/709,423, filed on Oct. 4, 2012.

(56) References Cited

U.S. PATENT DOCUMENTS

| | | | |
|---|---|---|---|
| 5,759,643 A | 6/1998 | Miyashita et al. | 428/1 |
| 5,783,299 A | 7/1998 | Miyashita et al. | 428/329 |
| 5,800,918 A | 9/1998 | Chartier et al. | 428/336 |
| 6,119,626 A | 9/2000 | Miyazawa et al. | 118/723 VE |
| 6,264,751 B1 | 7/2001 | Kamura et al. | 118/725 |
| 6,296,793 B1 | 10/2001 | Anthes et al. | 264/104 |
| 6,383,565 B1 | 5/2002 | Monaghan | 427/248.1 |
| 6,592,659 B1 | 7/2003 | Terrazas et al. | 106/287.13 |
| 6,929,822 B2 | 8/2005 | Kono | 427/164 |
| 7,070,849 B2 | 7/2006 | Mori et al. | 428/141 |
| 7,294,731 B1 | 11/2007 | Flynn et al. | 556/427 |
| 7,578,877 B2 | 8/2009 | Giessler et al. | 106/287.13 |
| 7,604,358 B2 | 10/2009 | Ninomiya et al. | 359/601 |
| 7,692,855 B2 | 4/2010 | Arrouy et al. | 359/382 |
| 8,211,544 B2 | 7/2012 | Itami et al. | 428/429 |
| 8,318,245 B2 | 11/2012 | Roisin et al. | 427/164 |
| 2001/0033893 A1 | 10/2001 | Anthes et al. | 427/162 |
| 2002/0050453 A1 | 5/2002 | Monaghan | 204/298.16 |
| 2002/0060848 A1* | 5/2002 | Mitsuishi et al. | 359/586 |
| 2003/0003227 A1 | 1/2003 | Kono | 427/162 |
| 2003/0165698 A1 | 9/2003 | Vaneeckhoutte et al. | 428/447 |
| 2003/0234460 A1 | 12/2003 | Hayashi et al. | 264/2.7 |
| 2004/0043260 A1 | 3/2004 | Nadaud et al. | 428/701 |
| 2004/0076750 A1 | 4/2004 | Boulineau et al. | 427/248.1 |
| 2004/0142185 A1 | 7/2004 | Takushima | 428/447 |
| 2006/0158738 A1* | 7/2006 | Nakamura et al. | 359/586 |
| 2006/0181774 A1 | 8/2006 | Ojima et al. | 359/586 |
| 2007/0104891 A1 | 5/2007 | Fournand | 427/561 |
| 2007/0184183 A1 | 8/2007 | Chu et al. | |
| 2007/0190342 A1 | 8/2007 | Teng | |
| 2008/0050600 A1 | 2/2008 | Fan et al. | 428/447 |
| 2008/0187766 A1 | 8/2008 | Heider et al. | 428/432 |
| 2008/0206470 A1 | 8/2008 | Thomas et al. | 427/402 |
| 2008/0213473 A1 | 9/2008 | Roisin et al. | 427/162 |
| 2008/0250955 A1 | 10/2008 | O'Brien | 101/216 |
| 2009/0098309 A1 | 4/2009 | Brody et al. | 427/534 |
| 2009/0208728 A1 | 8/2009 | Itami et al. | 428/318.4 |
| 2009/0216035 A1 | 8/2009 | Itami et al. | 556/419 |
| 2009/0226610 A1 | 9/2009 | Koenig et al. | 427/248.1 |
| 2009/0257022 A1 | 10/2009 | Abe et al. | 351/166 |
| 2010/0053547 A1 | 3/2010 | Baude et al. | 351/159 |
| 2010/0062217 A1 | 3/2010 | Kurematsu | 428/428 |
| 2010/0173149 A1 | 7/2010 | Hung | 428/336 |
| 2010/0238557 A1* | 9/2010 | Tomoda | 359/586 |
| 2011/0305874 A1 | 12/2011 | Thoumazet et al. | 428/172 |
| 2012/0009429 A1 | 1/2012 | Shmueli et al. | 428/447 |
| 2012/0013845 A1 | 1/2012 | Conte et al. | 351/166 |
| 2012/0109591 A1 | 5/2012 | Thompson et al. | 703/1 |
| 2012/0162095 A1 | 6/2012 | Liang et al. | 345/173 |
| 2012/0275026 A1 | 11/2012 | Zhou et al. | 359/601 |
| 2013/0025503 A1 | 1/2013 | Park et al. | 106/287.12 |

FOREIGN PATENT DOCUMENTS

| | | | |
|---|---|---|---|
| EP | 1 255 129 | 11/2002 | |
| EP | 0933377 | 11/2004 | |
| EP | 1 630 261 | 3/2006 | |
| EP | 1 328 579 | 3/2012 | |
| JP | 58-43402 | 3/1983 | |
| JP | 6029332 B | 4/1994 | B32B 27/00 |
| JP | 10-036142 | 2/1998 | |
| JP | 200180941 | 3/2001 | |
| JP | 2006-055731 | 3/2006 | |
| JP | 2007-240707 | 9/2007 | |
| JP | 2008-1869 | 1/2008 | |
| JP | 2009-299129 | 12/2009 | |
| WO | 2006/107083 A2 | 10/2006 | C07F 7/12 |
| WO | 2009/043122 | 4/2009 | |
| WO | 2011/060047 | 5/2011 | C09D 183/12 |
| WO | 2012/064989 A1 | 5/2012 | C07F 7/14 |
| WO | 2012/137744 | 10/2012 | |
| WO | 2012176990 | 12/2012 | |
| WO | 2013/099824 | 7/2013 | |

OTHER PUBLICATIONS

Thin Film Optical Filter, 3$^{rd}$ Edition, H. Angus Macleod, Institute of Physics Publishing Bristol and Philadelpia 2001.

Kondo et al; "Durable Anti-Smudge Materials for Display Terminals"; http://www.findarticles.com/p/articles/mi_qa5322/is_200906/ai_n32127531/.

Calottes R Willy, Practical Design and Production of Optical Thin Films; Mercel Dekker 1966, pp. 115-121.

Fuchs et al; "Wetting and Surface Properties of (Modified) Fluoro-Silanised Glass"; Colloids and Surfaces A: Physicochem. Eng. Aspects 307 (2007) 7-15.

Choy KL. In: Nalwa HS, Editor, Handbook of Nanostructured Materials and Nanotechnology vol. 1: Synthesis and Processing Academic Press; 2000 p. 533.

Machine translation WO2012176990.

Machine translation JP2001080941.

Patent Cooperation Treaty International Search Report for International Application No. PCT/US2012/067383; mailing date Jul. 8, 2013—11 pages.

Patent Cooperation Treaty International Search Report for International Application No. PCT/US2012/067370; mailing date Jul. 10, 2013—10 pages.

* cited by examiner

Figure 14
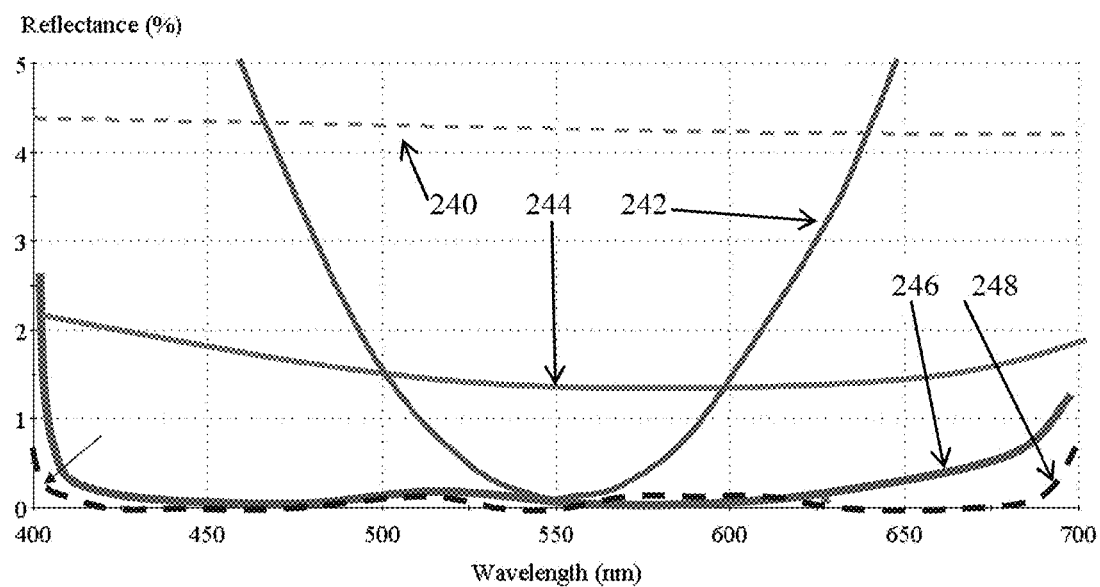
Figure 16 A,B
(Prior Art)
Figure 16A
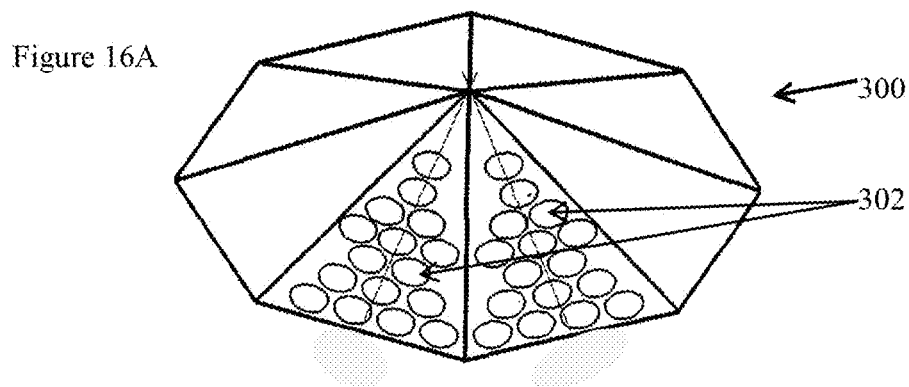
Figure 16B
Figure 16B
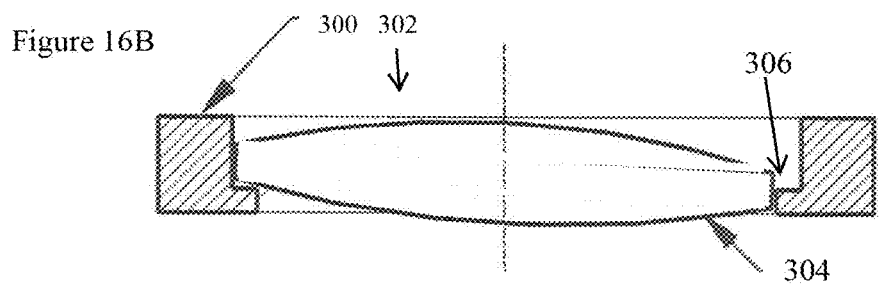

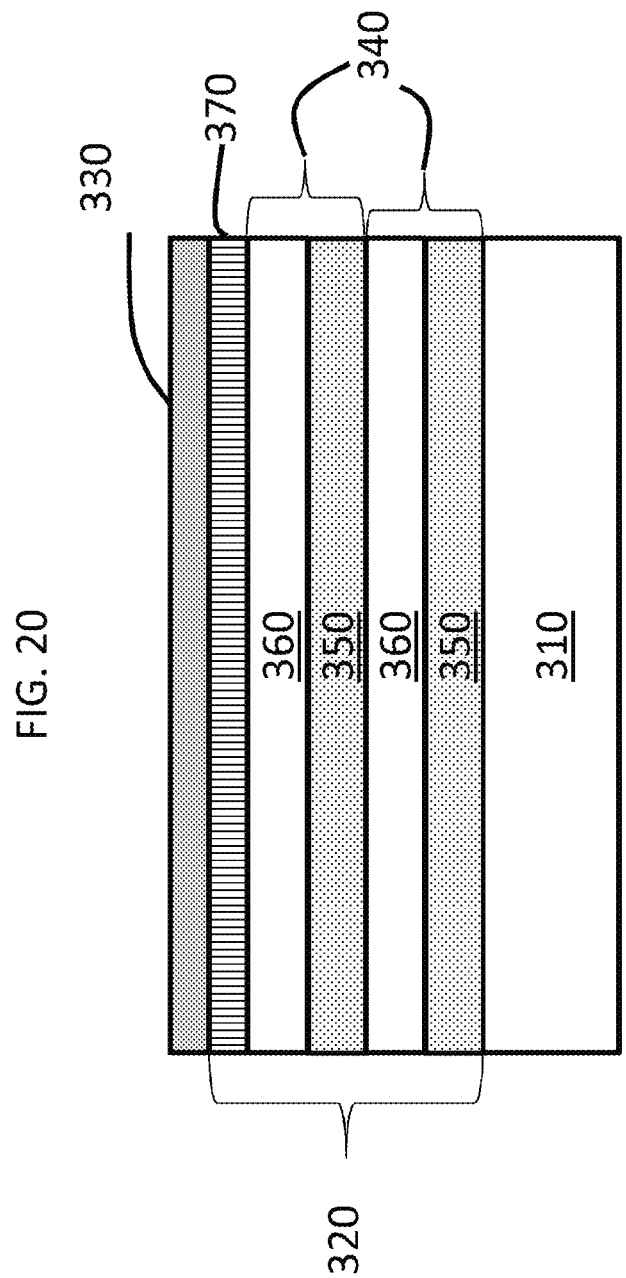

OPTICAL COATING METHOD, APPARATUS AND PRODUCT

PRIORITY

This application is a continuation of U.S. patent application Ser. No. 13/690829 titled "Optical Coating Method, Apparatus and Product" filed Nov. 30, 2012, the content of which is relied upon and incorporated herein by reference in its entirety and claims the benefit of priority under 35 U.S.C. §119 of U.S. Provisional Application No. 61/565,024 titled "Process for Making of Glass Articles With Optical and Easy-To-Clean Coatings" filed Nov. 30, 2011, and also claims the benefit of priority under 35 U.S.C. §119 of U.S. Provisional Application No. 61/709,423 titled "Optical Coating Method, Apparatus and Product" filed Oct. 4, 2012, the contents of which are relied upon and incorporated herein by reference in their entirety.

FIELD

This disclosure is directed to a process for making glass articles having an optical coating and an easy-to-clean (ETC) coating thereon, an apparatus for performing the process and an article made using the process. In particular, the disclosure is directed to a process in which the application of the optical coating and the ETC coating can be sequentially carried out using the same apparatus.

BACKGROUND

Glass, and in particular chemically strengthened glass, has become the material of choice for the view screen of many, if not most, consumer electronic products. For example, chemically strengthened glass is particularly favored for "touch" screen products whether they be small items such as cell phones, music players, eBook readers and electronic notepads, or larger items such as computers, automatic teller machines, airport self-check-in machines and other similar electronic items. Many of these items require the application of antireflective ("AR") coatings on the glass in order to reduce the reflection of visible light from the glass and thereby improve contrast and readability, for example, when the device is used in direct sunlight. However, some of the drawbacks of an AR coating are its sensitivity to surface contamination and its poor anti-scratch durability, that is, the AR coating becomes easily scratched during use, for example, by a wiping cloth or the dirt and grime on a user's finger. Fingerprints and stains are very noticeable on an AR coated surface and are not always easily removed. As a result, it is highly desirable that the glass surface of any touch device be easy to clean which is achieved by applying an easy-to-clean (ETC) coating to the glass surface.

The current processes for making glass articles having both antireflection and ETC coatings requires that the coating be applied using different equipment, and consequently separate manufacturing runs. The basic procedure is to apply the antireflection ("AR") coating to a glass article using, for example, a chemical vapor ("CVD") or physical vapor deposition ("PVD") method. In conventional processes, an optically coated article, for example, one with an AR coating, will be transferred from the optical coating apparatus to another apparatus to apply the ETC coating on top of the AR coating. While these processes can produce articles that have both an AR and an ETC coating, they require separate runs and have higher yield losses due to the extra handling that is required. This may result in poor reliability of the final product due to contamination arising from the extra handling between the AR coating and ETC coating procedures. For example, using the conventional 2-step coating process of ETC over an optical coating results in an article that is easily scratched in touch screen applications. In addition, while the AR coated surface can be cleaned before applying the ETC coating, this involves additional steps in the manufacturing process. All the additional steps increase the product costs. Consequently, alternative methods and apparatuses are needed by which both coatings can be applied using the same basic procedure and equipment, thus reducing manufacturing costs. Advantages of the process disclosed herein and resulting products are set forth in the following paragraphs and claims.

SUMMARY

In one embodiment, the disclosure provides a method for making a glass article having an optical coating and an easy-to-clean coating on top of the optical coating includes providing a coating apparatus having a vacuum chamber for the deposition of an optical coating and an ETC coating, providing a magnetic rotatable dome within said chamber for magnetically positioning a magnetic substrate carrier for receiving a glass substrate thereon that is to be coated, and providing within said vacuum chamber source materials for the optical coating and source materials for the ETC coating. The method also includes loading the glass substrate on the magnetic substrate carrier and magnetically attaching the magnetic substrate carrier having the glass substrate thereon to the dome, evacuating the vacuum chamber, rotating the dome and depositing an optical coating on the glass substrate, and rotating the dome and depositing the ETC coating on top of the optical coating following deposition of the optical coating, where the optical coating is not exposed to ambient atmosphere prior to the deposition of the ETC coating. The method further includes removing the substrate having the optical coating and the ETC coating from the chamber to obtain a glass substrate having a shadow-free optical coating deposited on the substrate and an ETC coating deposited on the optical coating.

In another embodiment, the disclosure provides a magnetic substrate carrier for holding a substrate during a coating process, where the magnetic substrate carrier includes a non-magnetic substrate carrier base having a plurality of magnets attached to the non-magnetic carrier base, a plurality of pins for supporting a surface of a glass substrate positioned on the substrate carrier, and a spring system that includes a retractable pin held in place by a spring that retracts the retractable pin, where the retractable pin is extendable in a direction opposite the spring. The spring system also includes a plurality of fixed pins and a plurality of stoppers extending from the non-magnetic substrate carrier base for a distance such that, when the glass substrate is positioned on the plurality of pins, the tops of the stoppers are below a top surface of the glass substrate.

In yet another embodiment, the disclosure provides a magnetic carrier for holding substrates during a coating process, where the substrate carrier includes a non-magnetic carrier base, a plurality of magnets attached to the non-magnetic carrier base, and a plurality of pins for supporting a surface of a glass substrate. The substrate carrier also includes a housing for a retractable pin and a retractable pin disposed in the housing, where the retractable pin is held in place by a spring and the retractable pin is outwardly biased from the housing, optional stoppers, and a plurality of movable pins for holding an edge of the glass article.

In yet another embodiment, the disclosure provides a glass article having an optical coating and an easy-to-clean coating on top of the optical coating, where the glass article is shadow free across an optically coated surface of the glass article. The optical coating includes a plurality of periods consisting of a layer of high refractive index material H having an index of refraction n greater than or equal to 1.7 and less than or equal to 3.0, and a layer of low refractive index material L having an index of refraction n greater than or equal to 1.3 and less than or equal to 1.6. The layer of high refractive index material is the first layer of each period and the layer of low refractive index material L is the second layer of each period. An $SiO_2$ capping layer having a thickness in the range greater than or equal to 20 nm and less than or equal to 200 nm is applied on top of the plurality of periods.

In another embodiment, the disclosure provides a coating apparatus for coating a substrate with an optical coating and an ETC coating. The coating apparatus may include: a vacuum chamber; a magnetic rotatable dome positioned in the vacuum chamber; at least one e-beam source positioned in the vacuum chamber; at least one thermal evaporation source positioned in the vacuum chamber; and a shadow mask adjustably positioned on a support within the vacuum chamber.

Additional features and advantages of the methods described herein will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

BRIEF DESCRIPTION OF THE DRAWINGS

FIG. 4B is a side view of FIG. 4A illustrating a glass substrate 140 resting on pins 136 that extend into the substrate carrier base 130 for a distance from the substrate carrier surface 130a, a plurality of magnets 134 that extend from the surface 130a of the substrate carrier 130 and through the substrate for a distance beyond the base 130b, a side stopper 150 extending from the base of carrier 130 to a distance from glass article 140's top face 140a;

FIG. 14 is a graph of Reflectance % versus wavelength and illustrating the effect of the numbers of AR coating layers/periods reflectance versus glass without an AR coating;

FIG. 16A illustrates a prior art dome carrier 300 having a plurality of openings 302 for placements of the lenses that are to be coated;

FIG. 16B illustrates a lens 304 that has slipped off one carrier 300 shoulder 306 inside opening 302, the lens 304 being in a position to be broken as the carrier 300 cools;

FIG. 20 graphically depicts the glass article of one or more embodiments including an optical coating and an ETC coating.

DETAILED DESCRIPTION

Figure 1A:
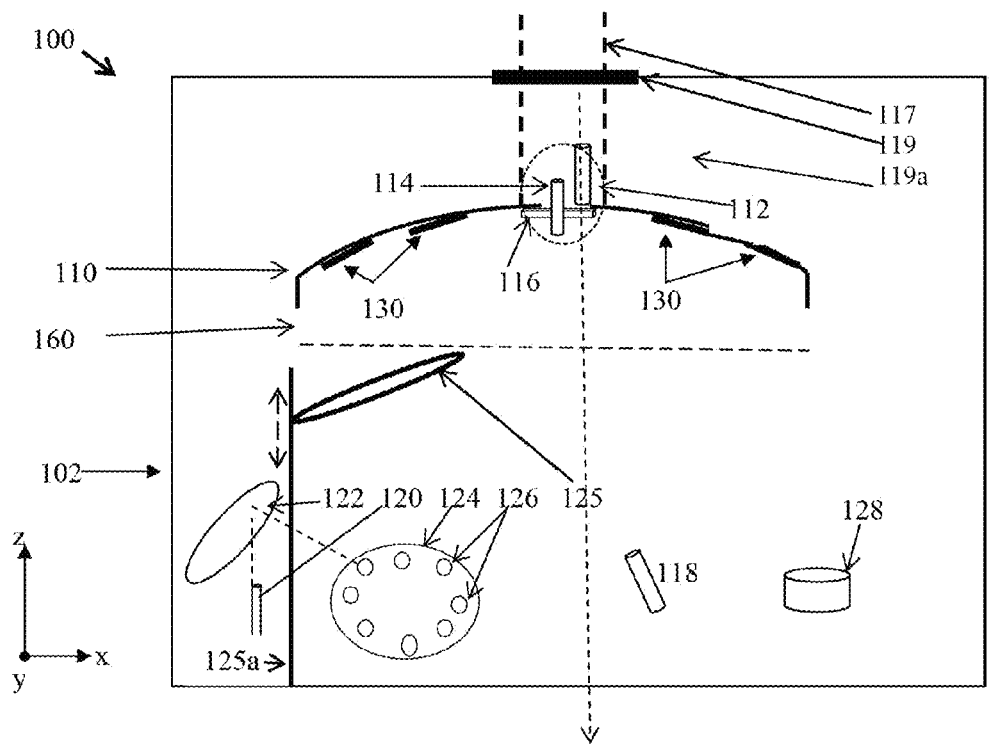
FIG. 1A is a schematic drawing of a coating apparatus 100 according to one or more embodiments described herein.

Reference will now be made in detail to embodiments of glass articles coated with optical coatings and easy-to-clean coatings and methods and apparatuses for forming the same, examples of which are illustrated in the accompanying drawings. Whenever possible, the same reference numerals will be used throughout the drawings to refer to the same or like parts. One embodiment of a coating apparatus is schematically depicted in FIG. 1A. The coating apparatus generally includes a vacuum chamber with a magnetic dome positioned therein. The coating apparatus also includes an e-beam source, a thermal evaporation source and a plasma source. Glass substrates to be coated can by magnetically attached to an underside of the dome and coated with an optical coating and an ETC coating using the e-beam source and the thermal evaporation source, respectively. In embodiments, the plasma source may be used to densify the deposited optical coating materials. Various embodiments of apparatuses and methods for sequentially applying optical coatings and ETC coatings to glass substrates will be described in more detail herein with specific reference to the appended drawings.

Herein the terms "process" and "method" may be used interchangeably. Also herein the terms "shadowless" and "shadow free" mean that the optical coating is uniformly deposited over the entire surface of the glass substrate such that, when the glass article with the coating deposited using the methods and apparatuses described herein is viewed, the shadow that is observed on glass articles having optical coating prepared using conventional optical coating methods and apparatuses is not observed. The shadow observed on conventionally coated glass articles arises when areas of the substrate being coated shield the surface of the substrate from the deposition of the optical coating materials. These shadows are frequently observed adjacent to elements that are used to hold the substrate being coated in place during the coating process or are on the substrate carrier for transport of the carrier and the elements being coated into and out of the coater.

The terms "glass article" and "glass substrate" are used herein interchangeably and generally refer to any glass item coated using the methods and apparatuses described herein.

The present disclosure is directed to a process in which both an optical coating, for example an AR coating, comprising alternating layers of high refractive index and low refractive index materials, and an ETC coating, for example a perfluoroalkylsilane coating, can be applied to a glass substrate in sequential steps (i.e., first applying the optical coating and then applying the ETC coating over the optical coating) using substantially the same procedure without exposing the article to air or ambient atmosphere at any time during the application of the optical coating and the ETC coating. A reliable ETC coating provides lubrication to surface(s) of glass, transparent conductive coatings (TCC), and optical coatings. In addition, the abrasion resistance of glass and optical coatings will be more than 10 times better than the conventional coating process or 100-1000 times better than an AR coating without an ETC coating by using an in-situ, one-step process in which the coatings are sequentially applied, as graphically depicted in FIGS. 10, 11, and 17B. Using such techniques, the ETC coating can be considered as part of the optical coating during design and, as such, the ETC coating will not change the desired optical performance. The glass articles described herein are shadow free across the optically coated surface of the glass.

A particular example of an in-situ process is a box coater schematically depicted in FIG. 1A. The box coater is equipped with an electron beam (e-beam) source for optical coatings, a thermal evaporation source for the ETC coating material, and an ion beam or a plasma source for surface cleaning before coating and optical coating impaction during coating to increase the density of the coating and the smoothness of the coating surface.

The optical coating is composed of high and median or low refractive index materials. Exemplary high index materials having an index of refraction n greater than or equal to 1.7 and less than or equal to 3.0 include: $ZrO_2$, $HfO_2$, $Ta_2O_5$, $Nb_2O_5$, $TiO_2$, $Y_2O_3$, $Si_3N_4$, $SrTiO_3$, $WO_3$; an exemplary median index material having an index of refraction n greater than or equal to 1.5 and less than 1.7 is $Al_2O_3$; and an exemplary low index materials having an index of refraction n greater than or equal to 1.3 and less than or equal to 1.6) include: $SiO_2$, $MgF_2$, $YF_3$, $YbF_3$. The optical coating stack that is deposited on a substrate comprises at least one material/layer to provide a specified optical function. In most cases, a high and a low index material can be used to design a complex optical filter (including AR coatings), for example, $HfO_2$ as the high index material and $SiO_2$ as the low index material. TCC (two-component coating) materials suitable for use in the coatings include ITO (indium tin oxide), AZO (Al doped zinc oxide), IZO (Zn stabilized indium oxides), $In_2O_3$, and similar binary and ternary oxide compounds.

In embodiments, the optical coatings are applied to glass substrates using PVD coating (sputtered or IAD-EB coated optical coating with thermal evaporation of the ETC coating). PVD is a "cold" process in which the substrate temperature is under 100° C. As a result there is no degradation of the strength of a chemically strengthened or tempered glass substrate to which the coatings are applied.

In the embodiments described herein, the glass used to make the shadow free, optical and ETC coated glass articles described herein may be an ion-exchanged or non-ion-exchanged glass. Exemplary glasses include silica glass, aluminosilicate glass, borosilicate glass, aluminoborosilicate glass and soda lime glass. The glass articles have a thickness in the range of 0.2 mm to 1.5 mm, and a length and width suitable for the intended purpose. Thus the length and width of the glass article can range from that of a cell phone to tablet computer, or larger.

The optical coatings referred to herein include antireflection coatings (AR coatings), band-pass filter coatings, edge neutral minor coatings and beam splitters, multi-layer high-reflectance coatings and edge filters as described in H. Angus Macleod, "*Thin Film Optical Filters*", $3^{rd}$ edition, Institute of Physics Publishing. Bristol and Philadelphia, 2001. Applications using such optical coatings include displays, camera lenses, telecommunications components, instruments, medical devices, photochromic and electrochromic devices, photovoltaic devices, and other elements and devices.

Alternating layers of high and low refractive index materials can be used to form optical coatings, such as antireflective or anti-glare for ultraviolet ("UV"), visible ("VIS") and infrared ("IR") applications. The optical coatings can be deposited using a variety of methods. Herein the PVD method (i.e., ion-assisted, e-beam deposition) for depositing the optical coatings is used as an exemplary method. The optical coatings comprise at least one layer of a high index material H and at least one layer of low index material L. Multilayer coatings consist of a plurality of alternating high and low index layers, for example, HL,HL,HL . . . , etc., or LH,LH,LH . . . , etc. One pair of HL layers (or LH layers) is referred to as a "period" or a "coating period." A medium index material M can be used in place of a low index material in all or some of the low index layers. The term "index," as used herein, refers to the index of refraction of the material. In a multilayer coating the number of periods can range widely depending on the function of the intended product. For example, for AR coatings, the number of periods can be in the range of greater than or equal to 2 and less than or equal to 20. An optional final capping layer of $SiO_2$ can also be deposited on top of the AR coating as a final layer. Various techniques may be used to deposit the ETC material on top of the optical coating without exposing the optical coating to the ambient atmosphere including, without limitation, thermal evaporation, chemical vapor deposition (CVD) or atomic layer deposition (ALD).

The optical coatings deposited on the glass substrates described herein may be multilayer optical coatings comprising at least one period of a high refractive index material and a low refractive index material. The high refractive index material may be selected from $ZrO_2$, $HfO_2$, $Ta_2O_5$, $Nb_2O_5$, $TiO_2$, $Y_2O_3$, $Si_3N_4$, $SrTiO3$, and $WO_3$; however, it should be understood that other suitable high refractive index materials may be used. The low refractive index material may be selected from the group consisting of $SiO_2$, $MgF_2$, $YF_3$, and $YbF_3$; however, it should be understood that other suitable low refractive index materials may be used. In some embodiments, the low refractive index material may be replaced with a medium refractive index material such as $Al_2O_3$ or another suitable medium refractive index material.

In one embodiment, the present disclosure is directed to a process in which, in a first step, a multilayer optical coating is deposited on a glass substrate followed by a second step in which the ETC coating is thermally evaporated and deposited in the same chamber as the optical coating. In another embodiment a multilayer optical coating is deposited on a glass substrate in one chamber followed by the thermal evaporation and deposition of the ETC coating on top of the multilayer coating in a second chamber, with the provision that the transfer of the multilayer coated substrate from the first chamber to the second chamber is carried out inline in a manner such the substrate is not exposed to air between the application of the multilayer coating and the ETC coating. The coating techniques utilized may include, without limitation PVD, CVD/PECVD, and ALD coating techniques. Depending on the size of the chamber or chambers and the size of the substrates being coated, one or a plurality of substrates can simultaneously be coated within a single chamber.

The multilayer optical coatings are typically oxide coatings in which the high index coating is a lanthanide series oxide such as La, Nb, Y, Gd or other lanthanide metals, and the low index coating is $SiO_2$. The ETC materials may be, for example, fluorinated silanes, typically alkyl perfluorocarbon silanes having the formula $(R_f)_x SiX_{4-x}$, where $R_f$ is a linear $C_6$-$C_{30}$ alkyl perfluorocarbon, X=Cl or —$OCH_3$— and x=2 or 3. The fluorocarbons have a carbon chain length in the range of greater than or equal to 3 nm and less than or equal to 50 nm. The fluorocarbons can be obtained commercially from vendors including, without limitation, Dow-Corning (for example fluorocarbons 2604 and 2634), 3M Company (for example ECC-1000 and 4000). Daikin Corporation, Canon, Don (South Korea), Ceko (South Korea), Cotec-GmbH (for example DURALON UltraTec) and Evonik.

Figure 2:
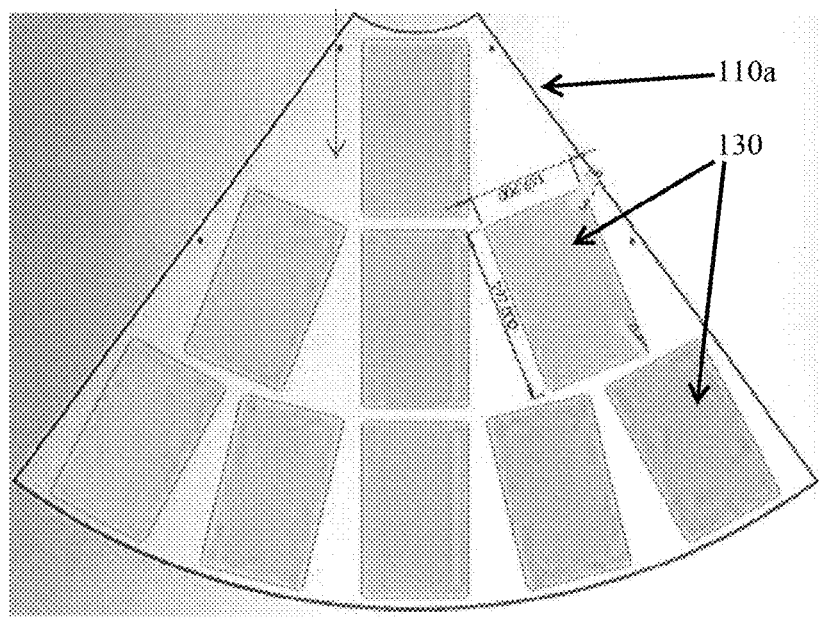
FIG. 2 is a drawing representing a top-down view through a section of the dome of the coating apparatus of FIG. 1A illustrating a plurality of substrate carriers magnetically attached to the dome.

FIG. 1A schematically depicts a coating apparatus 100 and various operating elements of the apparatus according to one or more embodiments disclosed herein. Coordinate axes are provided for reference. In a frontal view x is from side-to-side (i.e., left to right), y is from front-to-back (i.e., in and out of the page) and z is from bottom-to-top. The coating apparatus 100 generally comprises a vacuum chamber 102 having therein a magnetic rotatable dome 110 with lip 161 (depicted in FIG. 3A) that is part of a frame 160 (further illustrated in FIG. 3B) that supports dome 110. The dome includes a plurality of substrate carriers 130 magnetically attached to an underside of the dome as illustrated in FIG. 2. A plasma source 118 is located in the vacuum chamber 102 below the dome 110 and is generally oriented to emit ions or plasma upwards, towards the underside of the dome 110. The plasma source is used to densify the optical coating materials as they are deposited and/or after deposition thereby increasing the hardness of the finished optical coating. Specifically, the ions or plasma emitted from the plasma source impact the coating during deposition and/or after a coating layer has been applied resulting in a densification of the deposited material. Densifying the deposited optical coating improves the abrasion resistance of the optical coating. For example, in some embodiments, the deposited optical coating will have at least double the abrasion reliability or abrasion resistance of an optical coating deposited without the use of a plasma source.

The coating apparatus further comprises an e-beam source 120 located below the dome 110 and an e-beam reflector 122 for directing the e-beam from the e-beam source toward the optical coating material being applied to the glass substrate to thereby vaporize the optical material. A shadow mask 125 for enabling uniform coating across the dome is located below the dome 110. The shape and position of the shadow mask 125 are adjustable such that the shadow mask is "tunable" to achieve a desired coating uniformity. The shadow mask 125 is positioned on a support 125a such that the position of the shadow mask 125 can be adjusted vertically along the support 125a, as indicated by the dashed double headed arrow. The position of the shadow mask 125 on the support 125a can be adjusted as needed to prevent the shadow mask from shielding the glass substrates located on the underside of the dome 110 from the ions or plasma emitted from the plasma source 118 as the optical coating is applied. While FIG. 1A depicts a single e-beam source 120, it should be understood that a plurality of e-beam sources can be used to minimize the time to change from one coating material to another, for example, changing from $Nb_2O_5$ to $SiO_2$ and back again, as required to deposit the required number of individual layers of material for the optical coating. For example, in some embodiments, the coating apparatus may comprise greater than or equal to 2 e-beam sources and less than or equal to 6 e-beam sources. When a plurality of e-beam sources are used, each e-beam source may be directed to a separate container (i.e., the boats 126, described further herein) holding the material to be coated.

The coating apparatus 100 further comprises an optical coating carrier 124 having a plurality of boats 126 which contain the optical coating material. The boats 126 are separate source containers used to contain the different materials used to deposit the optical coating layer. The optical coating carrier 124 is positioned in the vacuum chamber 102 such that an e-beam emitted from the e-beam source 120 can be reflected by the e-beam reflector 122 onto the optical coating material contained in the boats 126, thereby vaporizing the optical coating material. The boats 126 contain different optical coating materials so that only one type of coating material (e.g., either a high refractive index, low refractive index, or medium refractive index material), is applied at one time. After the proper thickness of one coating material is reached the lid (not depicted) of the corresponding boat is closed and a lid to another boat containing a different coating material to be applied is opened. In this manner the high refractive index material, low refractive index material, or medium refractive index material can be applied in an alternating manner to form an optical coating material having the desired optical properties.

The coating apparatus 100 also comprises at least one thermal evaporation source 128 for evaporating the ETC coating material to facilitate depositing the coating material onto glass substrates retained on the underside of the dome 110. The at least one thermal evaporation source 128 is positioned in the vacuum chamber 102 below the dome 110.

Figure 1B:
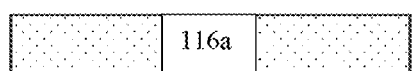
FIG. 1B schematically depicts an enlarged view of glass plate 116 and illustrates the opening 116a for receiving a quartz monitor.

Still referring to FIG. 1A, the dome 110 is made of a light weight material that is magnetic or contains a magnetic material, for example and without limitation, aluminum containing iron or another suitable magnetic material. The dome 110 can be rotated either clockwise or counter-clockwise. At the top center of the dome is an opening 164 (depicted in FIG. 3B) and a transparent glass plate 116 is placed on the underside of the dome to cover the opening. The transparent glass plate 116 may include an opening 116a as depicted in the enlarged view of the transparent glass plate 116 depicted in FIG. 1B. A quartz monitor 114 is received in and passes through the transparent glass plate 116. An optical fiber 112 is positioned above the transparent glass plate 116, as illustrated. The quartz monitor 114 controls the deposition rate of the optical materials by feedback to the e-beam power supply so that the deposition rate of the coating material is kept substantially constant. The optical fiber 112 is positioned above the transparent glass plate 116 to protect it from the deposition materials within the vacuum chamber 102. The optical fiber measures reflectance to determine when the deposition of each layer of the coating material should be stopped because it has reached the targeted design thickness.

Figure 1C:
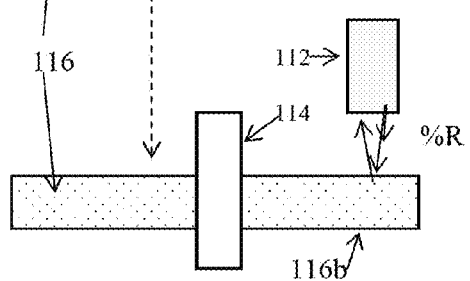
FIG. 1C schematically depicts an enlarged view of the glass plate with the quartz monitor received within the opening and an optical fiber, both of which are used to measure and control the deposition of the optical coating materials onto glass substrates attached to a substrate carrier.

FIG. 1C is an enlargement of the circled area of the transparent glass plate 116 of FIG. 1A showing the relative orientations of the optical fiber 112, the quartz monitor 114 and the transparent glass plate 116. The quartz monitor 114 is positioned in the middle of the transparent glass plate 116 and passes through the opening 116a. The optical fiber 112 is positioned to the side of the quartz monitor 114. Light transmitted from the optical fiber 112 passes through the transparent glass plate 116 and is reflected back as the surface of the transparent glass plate is coated. The arrows adjacent to % R schematically depict the reflectance of light from the surface 116b of the transparent glass plate as the transparent glass plate is being coated. The reflectance increases with the thickness of the coatings applied to surface 116b of the transparent glass plate. The light reflected from the surface 116b of the transparent glass plate is directed back to an optical sensor (not shown) coupled to a controller (not shown) of the e-beam source. The output of the optical sensor (which is indicative of the thickness of the applied optical coating and/or the ETC coating) is utilized by the controller to determine the deposited thickness of the coatings. As such, the reflected light can be used to control the deposited thickness of an individual layer, a coating period, and the entire optical coating as well as the deposited thickness of the ETC coating.

The top of the dome 110 is attached to a vacuum shielded rotation shaft 117 indicated by the dashed parallel lines. The vacuum shielded rotation shaft 117 has a vacuum seal bearing 119 attached to the vacuum shielded rotation shaft for rotating the vacuum shielded rotation shaft 117 and dome 110. Accordingly, it should be understood that the vacuum shielded rotation shaft 117 is vacuum sealed to the top of the dome 110. The vacuum shielded rotation shaft 117 is driven by an external motor (not illustrated) located external to the vacuum chamber 102. In an embodiment, the dome 110 may be rotated at a rotation frequency in the range from about 20 rpm to about 120 rpm. In another embodiment the rotation frequency is in the range from about 40 rpm to about 83 rpm.

FIG. 2 schematically depicts a segment 110a of dome 110. As shown in FIG. 2, a plurality of substrate carriers 130 are magnetically attached to the dome 110. The substrate carriers 130 are utilized to secure glass substrates for coating in the coating apparatus 100.

Figure 3A:
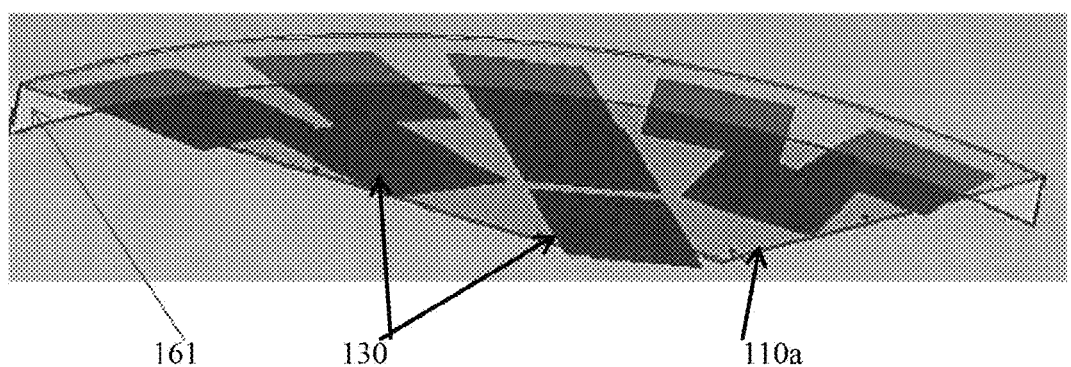
FIG. 3A schematically depicts an oblique bottom-up side view of a segment of the dome of the coating apparatus of FIG. 1A with a plurality of substrate carriers magnetically attached to the dome.
Figure 3B:
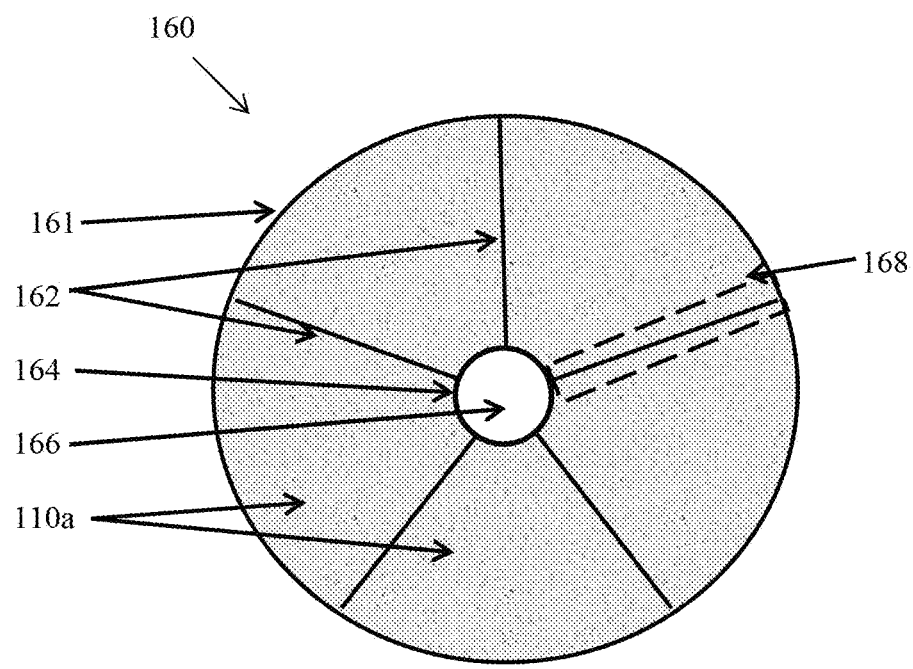
FIG. 3B schematically depicts a frame that supports the dome segments 110a; frame 160 having an outer lip/rim 161 as is also illustrated in FIG. 3A, an inner rim (not numbered) at opening 164 to which the rotation shaft 117 can be attached (not illustrated) and a plurality of spokes 162 that are sufficiently wide to accommodate the side edges of the dome segments as is illustrated at 168.

FIG. 3A is a drawing illustrating an oblique bottom-up side view of a segment 110a of the dome 110 showing the lip 161 with a plurality of substrate carriers 130 magnetically attached to the dome 110. FIG. 3B is an illustration of the frame 160 that is used to support a plurality of segments 110a. The frame 160 has an outer lip 161 (as depicted in FIG. 3A), an inner rim (not numbered) adjacent to opening 164 to which the vacuum shielded rotation shaft 117 can be attached (not illustrated) and a plurality of spokes 162 extending radially outward from the inner rim. The spokes 162 are sufficiently wide to accommodate the side edges of the dome segments as is illustrated at 168.

Figure 17A:
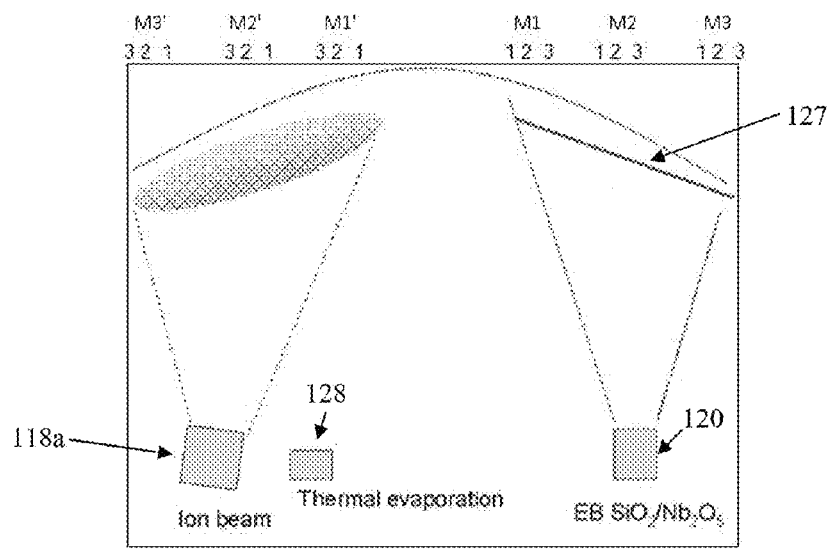
FIG. 17A is an illustration of an embodiment of the coating apparatus having a shadow mask covering a selected area of the dome to improve the uniformity of the optical coating.

FIG. 17A is a simplified illustration of an alternative embodiment of a coating apparatus for depositing an optical coating and an ETC coating on a substrate. In this embodiment, the coating apparatus includes a shadow mask 127 covering a selected area of the dome to improve the uniformity of the optical coating deposited on the substrate. The support for adjustably supporting the shadow mask 127 is not depicted in FIG. 17A. In the coating apparatus of FIG. 17A the plasma source is an ion source 118a. Since the ion source 118a and the e-beam source 120 used to evaporate the optical coating materials are located on different sides of the vacuum chamber, the ion source is not shielded by the shadow mask, thereby improving the efficacy of the ion source 118a in hardening the deposited optical coating materials. The ion source is used to densify the optical coating material to near bulk density thereby increasing the hardness of the optical coating and improving the abrasion reliability/abrasion resistance of the optical coating.

Figure 4A:
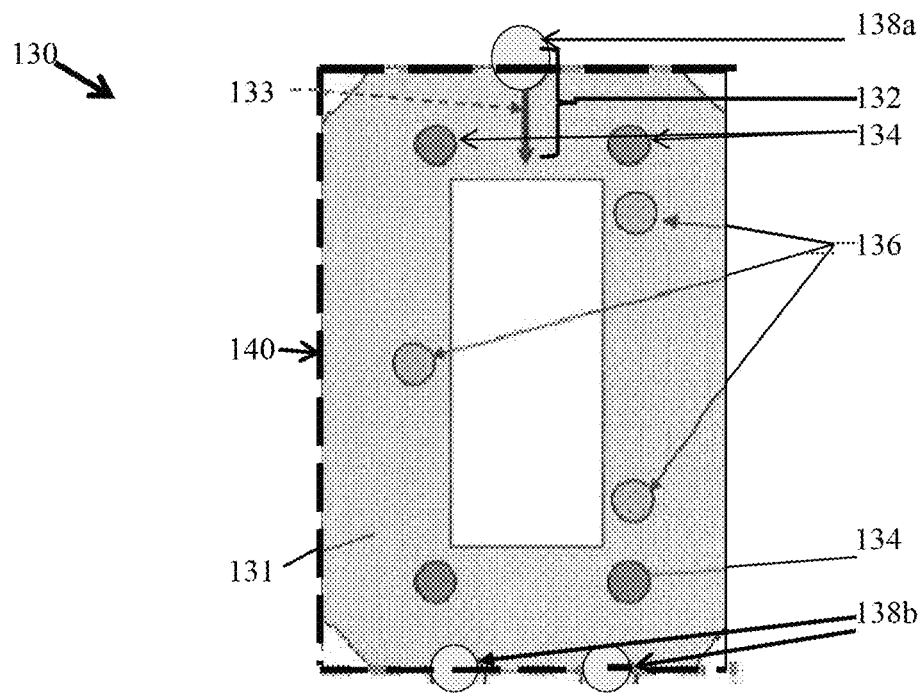
FIG. 4A schematically depicts a non-magnetic substrate carrier 130 having a plurality of elements 134 for magnetically attaching the carrier to dome 110 and for holding a glass substrate/article 140 during the coating process.
Figure 4B:
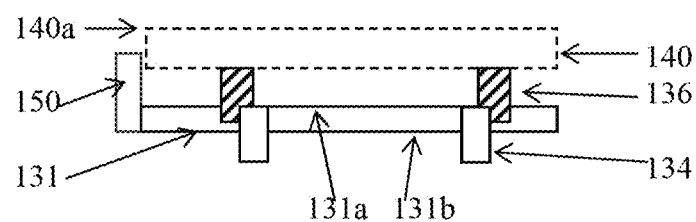

Referring now to FIGS. 4A and 4B, a substrate carrier 130 made for carrying a single size substrate is schematically depicted. As illustrated in FIG. 4A, the substrate carrier 130 has a non-magnetic substrate carrier base 131, a plurality of magnets 134 for magnetically attaching the carrier to the dome 110 and for off-setting the substrate carrier a distance from the dome. The substrate carrier 130 also includes a plurality of pins 136 for supporting a surface of a glass substrate 140 (illustrated in FIG. 4B) and a spring system 132. The spring system 132 generally includes a retractable pin 138a that is held in place by a spring 133 (schematically depicted as an arrow) that biases the retractable pin 138a in the direction indicated by the arrow, and a plurality of fixed pins 138b. Pins 138a and 138b are used to hold a glass substrate 140 (indicated by dashed line) in place on the substrate carrier 130 while the glass substrate is being coated. FIG. 4B is a side view of FIG. 4A illustrating a glass substrate 140 supported on pins 136 that extend into the nonmagnetic substrate carrier base 131 for a distance from the substrate carrier base surface 131a, a plurality of magnets 134 that extend from the surface 131a of the substrate carrier 130 and through the substrate for a distance beyond the base 131b, a side stopper 150 extending from of the nonmagnetic substrate carrier base 131 to a distance from a top surface 140a of the glass substrate 140. The side stopper 150 orients the glass substrate on the nonmagnetic substrate carrier base 131 without affecting the application of the coatings thereby preventing "shadows" on the surface of the glass substrate. Specifically, the top surface 140a of the glass substrate is the surface that will be coated with the optical coating and the easy-to-clean coating. For a glass substrate having a thickness of 5 mm, the top of side stopper 150 will be in the range of 2-3 mm below the top surface 140a of the glass substrate 140. The opening (not numbered) in the middle of the substrate carrier reduces the weight of the carrier.

Figure 15:
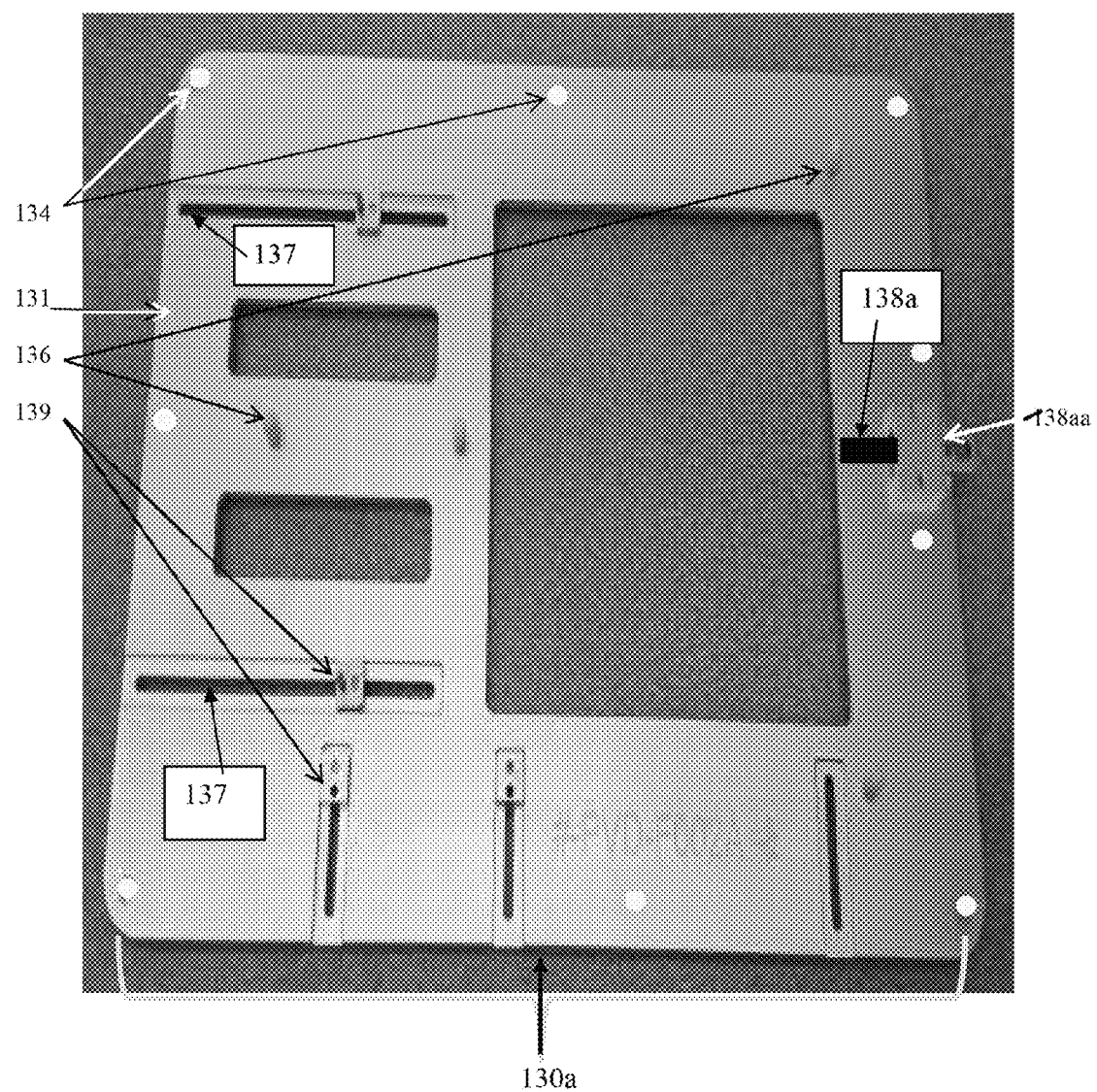
FIG. 15 illustrates an adjustable magnetic carrier 130a that is substantially similar to the carrier 130 illustrated in FIG. 4A and enables the use of a single carrier for different size substrates.

Referring now to FIG. 15, an adjustable substrate carrier 130a similar to the fixed substrate carrier 130 illustrated in FIG. 4A is depicted. The adjustable substrate carrier 130a has a non-magnetic substrate carrier base 131 which includes a plurality of magnets 134 for attaching the adjustable substrate carrier to the dome of the coating apparatus as described above. The adjustable substrate carrier 130a also includes a plurality of pins 136 extending from the surface of the substrate carrier for supporting a surface of a glass substrate positioned on the adjustable substrate carrier 130a. A housing 138aa is positioned proximate an edge of the adjustable substrate carrier 130a and houses a retractable pin 138a (depicted partially extended from the housing). The housing 138aa includes a spring (not shown) positioned in the housing 138aa. The spring bias the retractable pin 138a outward from the housing 138aa. The adjustable substrate carrier 130a may optionally include side stoppers 150a (not illustrated in FIG. 15) for orienting a glass substrate on the adjustable substrate carrier 130a. In the embodiment depicted in FIG. 15, the adjustable substrate carrier 130a further includes a plurality of moveable pins 139 for holding an edge of the glass substrate. The moveable pins 139 are positioned in tracks 137 to facilitate adjustably positioning the moveable pins 139 relative to the adjustable substrate carrier 130a. The moveable pins 139, in combination with the retractable pin 138a enable the use of a single carrier for different size substrates. The substrate or substrates may be held by the pins, and any optional side stoppers 150a in the same manner as described above with respect to FIG. 4A so that a shadow free coating is formed on the substrate.

As indicated in the foregoing paragraph, the substrate carriers 130, 130a have a non-magnetic substrate carrier base 131 and a plurality of magnets 134 for holding the carrier to the dome 110 and for off-setting the carrier a distance from the dome. The use of these magnetic carriers is an improvement over dome carriers that are used in the coating of optical elements such as lenses. For example, FIG. 16A illustrates a conventional dome carrier 300 having a plurality of openings 302 for positioning lenses that are to be coated. When the lenses are coated they are inserted into an opening in the carrier. However in this conventional design it is difficult to uniformly coat both the inside and outside of the dome. It is also difficult to keep the coating material away from surfaces of the lenses that are not to be coated. In addition, the part being coated can move with respect to the opening in the dome as the dome heats up, resulting in breakage as the dome cools after coating. For example, FIG. 16B illustrates a lens 304 that has slipped off one support shoulder 306 inside an opening 302 of the dome carrier. As is easily seen, if the carrier cools faster than the lens 304, the contraction of the carrier can cause the lens to break. In the present application, since the substrate carrier is off-set a distance from the dome by the magnets that hold the carrier to the dome, heat transfer is minimized and breakage does not occur as the dome cools. In addition, only one side of the glass article being coated is subjected to the coating materials due to the proximity of the carrier/substrate combination to interior surface of the dome. As a result the difficulties mentioned above in conventional dome carriers can be avoided.

Figure 5:
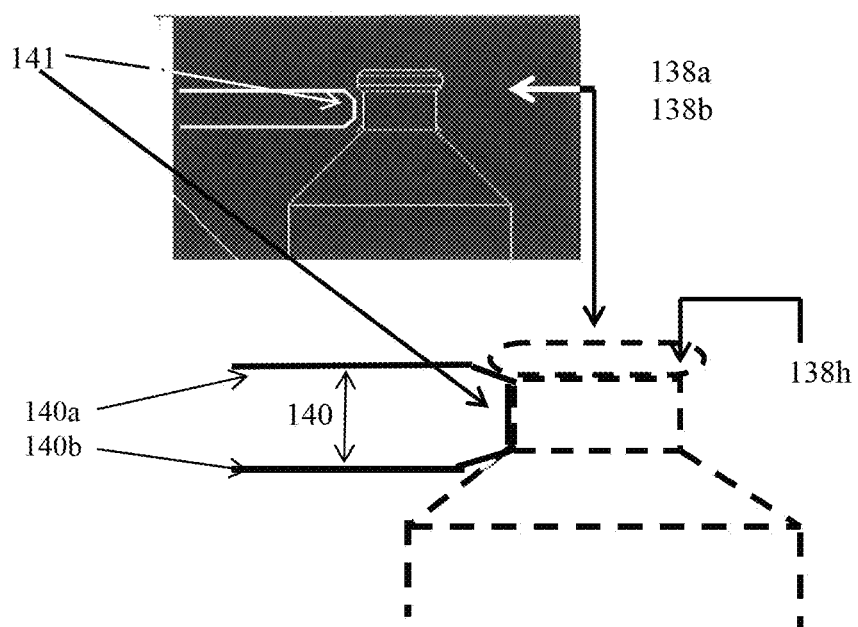
FIG. 5 schematically depicts one of the pins 138a and 138b against which a glass substrate 140 is held by the force exerted against it by a spring loaded adjustable pin 138a, and a shaped edge 141 that is in contact with the pin, in this case a chamfered edge.

Referring now to FIG. 5, a cross section of the pins 138a and 138b against which a glass substrate is held by the force exerted against it by the retractable pin 138a is schematically depicted. The glass substrate has a shaped edge which fits between the head 138h of pins 138a and 138b and the remainder of the body of the pin. The edge of the glass substrate may be chamfered as illustrated at 141, rounded, bull nosed or otherwise contoured. When the glass substrate 140 is engaged with the pins 138a, 138b, the top 140a of the glass substrate is 2-3 mm below the top of the pin 138a or 138b. In this figure, reference numeral 140b indicates the bottom surface of glass substrate 140.

Figure 6:
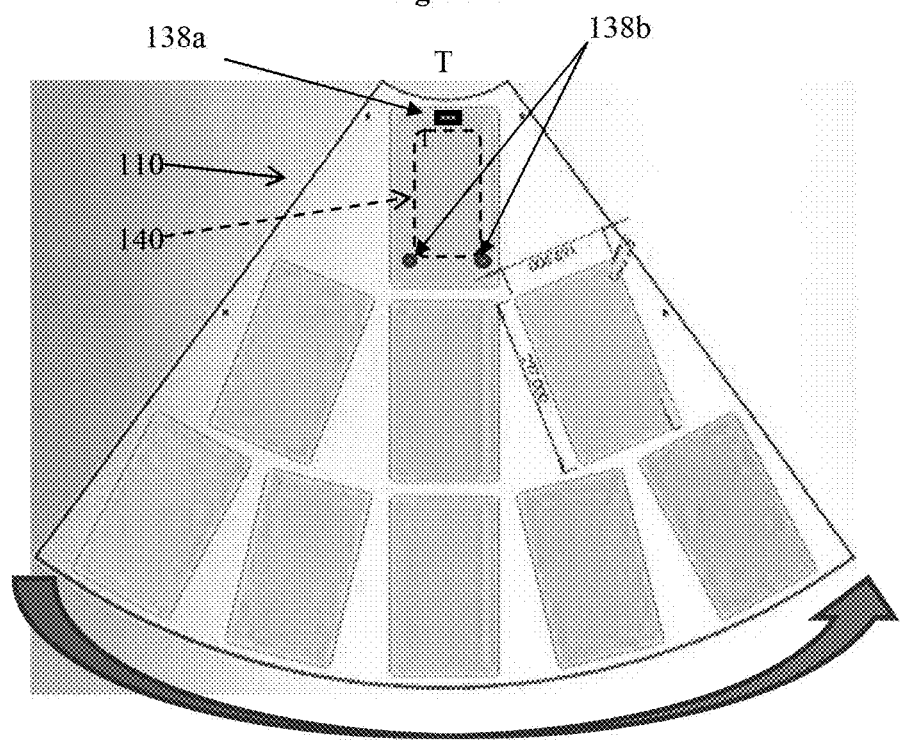
FIG. 6 illustrates substrate carriers 130 attached to dome 110 such that the retractable pin 138A, is positioned perpendicular to the rotation direction, that is, closer to opening at the top T of the dome 110 than the pins 138b also illustrated in FIG. 6.

Referring now to FIG. 4A and FIG. 6, a glass substrate 140 is loaded onto the substrate carrier 130 and the combination of the glass substrate 140 and the substrate carrier 130 is magnetically attached to the underside of dome 110. When the substrate carrier 130 with glass substrate 140 (dashed line) is loaded onto the dome 110 for coating, the retractable pin 138a is positioned perpendicular to the rotation direction of the dome 110 as indicated by the arrow; that is, the pin is closer to the opening at the top T of the dome 110 than the fixed pins 138b. When the substrate carrier is so positioned the optical coating is uniformly deposited over the entire surface of the glass substrate 140 to form a "shadowless" or "shadow free" coated glass substrate 140. These terms, "shadowless" and "shadow free," refer to the fact that if:

(1) the retractable pin 138a is not positioned on dome 110 as described and illustrated in FIG. 6, and
(2) the top surface 140a of glass substrate 140 is less than 1 mm below head 138h of pin 138a, and
(3) the top of side stoppers 150 are not lower than the top surface 140a;

then the deposition of the optical coating will be non-uniform in the areas where these elements and other elements holding the substrate are located. As a result, the optical coating will be thinner near these elements and thicker as one moves away from them. The result is a non-uniform optical deposition or "shadow" that can be noticed by a user of the articles. Such shadows can be avoided using the apparatus and methods described in this disclosure.

Referring again to FIG. 1A, once the adjustable substrate carrier 130a is magnetically attached to the dome 110, the materials for applying the optical coating to the glass substrate are loaded into separate boats 126 (i.e., separate source containers) of the optical coating carrier 124. As noted hereinabove, the optical coating is composed of alternating layers of high and low refractive index materials or alternating layers of high and middle refractive index materials. Exemplary high index materials having an index of refraction n greater than or equal to 1.7 and less than or equal to 3.0 are: $ZrO_2$, $HfO_2$, $Ta_2O_5$, $Nb_2O_5$, $TiO_2$, $Y_2O_3$, $Si_3N_4$, $SrTiO_3$, $WO_3$; an exemplary medium index material having an index of refraction n greater than or equal to 1.5 and less than 1.7 is $Al_2O_3$; and an exemplary low index materials having an index of refraction n greater than or equal to 1.3 and less than or equal to 1.6) are: $SiO_2$, $MgF_2$, $YF_3$, $YbF_3$. In some embodiments, medium refractive index material may be used to form the low refractive index layer L. Accordingly, in some embodiments, the low index material may be selected from $SiO_2$, $MgF_2$, $YF_3$, $YbF_3$ and $Al_2O_3$. In an exemplary embodiment, the optical coating materials are oxide coatings in which the high index coating is a lanthanide series oxide such as La, Nb, Y, Gd or other lanthanide metals, and the low index coating is $SiO_2$. In addition, the material for applying the easy-to-clean (ETC) coating is loaded in to the at least one thermal evaporation source 128. As noted hereinabove the ETC materials may be, for example, fluorinated silanes, typically alkyl perfluorocarbon silanes having the formula $(R_F)_xSiX_{4-x}$, where $R_f$ is a linear $C_6$-$C_{30}$ alkyl perfluorocarbon, $X=Cl$ or $—OCH_3—$ and $x=2$ or 3. The fluorocarbons have a carbon chain length in the range of greater than or equal to 3 nm and less than or equal to 50 nm.

Once the coating materials are loaded, the vacuum chamber 102 is sealed and evacuated to a pressure less than or equal to $10^{-4}$ Torr. The dome 110 is then rotated in the vacuum chamber by rotating the vacuum shielded rotation shaft 117. The plasma source 118 is then activated to direct ions and/or plasma towards the glass substrates positioned on the underside of the dome 110 to densify the optical coating materials as they are applied to the glass substrate. Thereafter the optical coating and ETC coating are sequentially applied to the glass substrate. The optical coating is first applied by vaporizing the optical materials positioned in the boats 126 of the optical coating carrier 124. Specifically, the e-beam source 120 is energized and emits a stream of electrons which are directed onto the boats 126 of the optical coating carrier 124 by the e-beam reflector 122. The vaporized material is deposited on the surface of the glass substrates as the glass substrates are rotated with the dome 110. The rotation of the dome 110, in conjunction with the shadow mask 125 and the orientation of the glass substrates on the substrate carriers 130, allows the optical coating materials to be uniformly coated onto the glass substrate carriers, thereby avoiding "shadows" on the coated surface of the glass substrate. As described hereinabove, the e-beam source 120 is utilized to sequentially deposit layers of high refractive index material and low refractive index material or medium refractive index material to achieve an optical coating having the desired optical properties. The quartz monitor 114 and the optical fiber 112 are utilized to monitor the thicknesses of the deposited materials and thereby control the deposition of the optical coating, as described herein.

Once the optical coating has been applied to the glass substrate to the desired thickness using the desired coating material(s), optical coating ceases and the ETC coating is applied over the optical coating by thermal evaporation as the glass substrate rotates with the dome 110. Specifically, the ETC material positioned in the at least one thermal evaporation source 128 is heated, thereby vaporizing the ETC material in the vacuum chamber 102. The vaporized ETC material is deposited on the glass substrate by condensation. The rotation of the dome 110 in conjunction with the orientation of the glass substrates on the substrate carriers 130 facilitates uniformly coating the ETC materials onto the glass substrate. The quartz monitor 114 and the optical fiber 112 are utilized to monitor the thicknesses of the deposited materials and thereby control the deposition of the ETC coating, as described herein.

Figure 7:
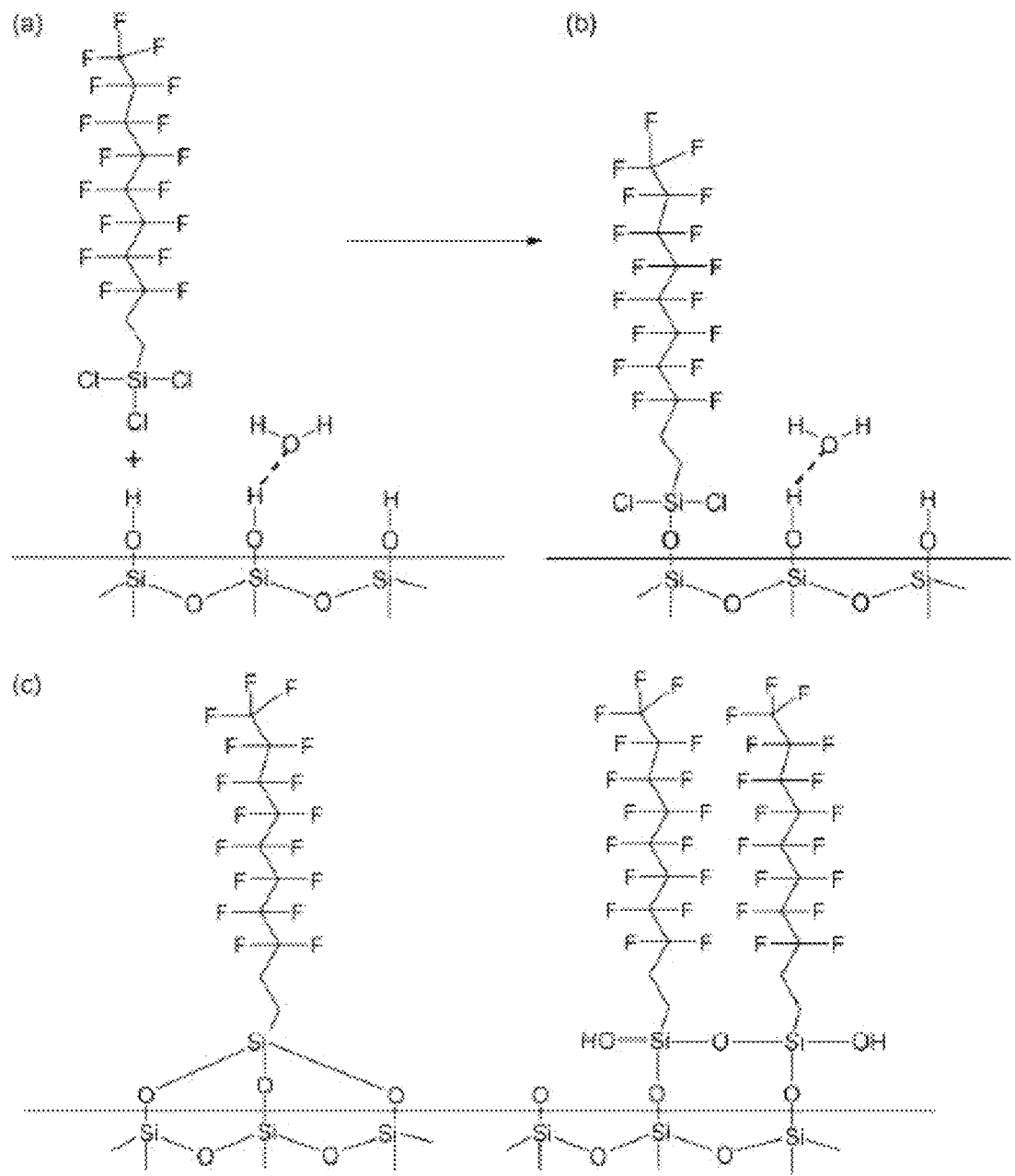
FIG. 7a-c is a schematic representation of the fluorinated silane grafting reaction with glass or an oxide AR coating.

FIGS. 7(*a*)-(*c*) are a schematic representation of the fluorinated silane grafting reactions with glass or an oxide optical coating (i.e., the reaction between the ETC coating material and the glass or an oxide optical coating). FIG. 7*c* illustrates that, when fluorocarbon trichlorosilane is grafted to the glass, the silane silicon atom can be either (1) triply bonded (three Si—O bonds) to the glass substrate or the surface of a multi-layer oxide coating on the substrate or (2) doubly bonded to a glass substrate and have one Si—O—Si bond to an adjacent $R_F$Si moiety. The ETC coating process time is very short and can be used to provide an ETC coating having a thickness in a range from greater than or equal to 3 nm and less than or equal to 50 nm over the freshly applied optical coating without breaking vacuum (i.e., without exposing the optical coating to ambient atmosphere). In the coating process described herein the ETC material is evaporated from a single source. However it should be understood that the ETC material may also be simultaneously evaporated from a plurality of sources. For example, it has been found that 2-5 separate ETC material sources may be advantageous. Specifically, the use of a plurality of sources containing the ETC material results in a more uniform ETC coating and can enhance coating durability. The term "sources" as used herein, refers to the containers or crucibles from which the ETC material is thermally evaporated.

Figure 8:
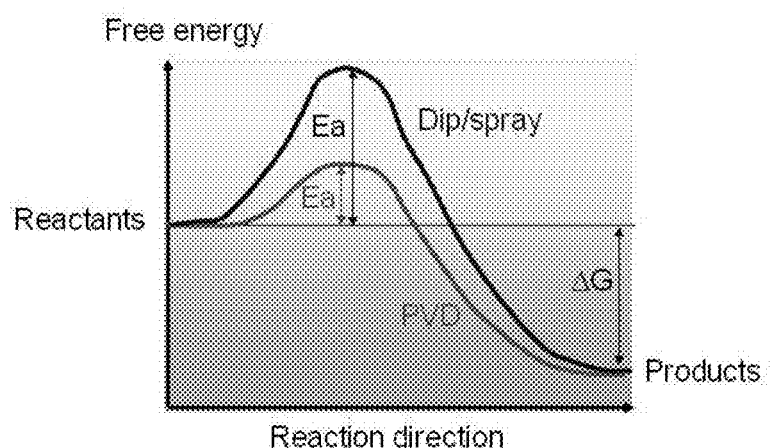
FIG. 8 illustrates the AR optical coating layers that would underlie the ETC coating to provide a barrier to isolate glass surface chemistry and contamination, and further to provide a lower activation energy site for fluorinated silanes to chemically bond to the AR optical coating with maximum coating density as well as crosslinking over the coated surface in order to maximize abrasion reliability (durability)

In the embodiments described herein, an $SiO_2$ layer is generally applied as a capping layer for optical coatings. The $SiO_2$ layer is generally deposited as part of the optical coating prior to the deposition of the ETC coating. This $SiO_2$ layer provides a dense surface for grafting and crosslinking of silicon atoms of the ETC coating as these layers were deposited at high vacuum ($10^{-4}$-$10^{-6}$ Torr) without the presence of free OH. Free OH, for example a thin layer of water on the glass or AR surface, is detrimental during ETC material deposition because the OH prevents the silicon atoms in the ETC material from bonding with the oxygen atoms of metal oxide or silicon oxide surfaces, that is, the optical coating surface. When the vacuum in the deposition apparatus is broken, that is, the apparatus is opened to the atmosphere, air from the environment, which contains water vapor, is admitted and the silicon atoms of the ETC coating react with the optical coating surface to create at least one chemical bond between the ETC silicon atom and surface oxygen atom, and release alcohol or acid once exposed to air. Since the ETC coating material typically contains 1-2 fluorinated groups and 2-3 reactive groups such as $CH_3O—$ groups, the ETC coating is capable of bonding to 2-3 oxygen atoms at the optical coating surface, or crosslinking with another coating molecule as shown in FIG. 7(*c*), to create a strongly bonded ETC coating. The PVD deposited $SiO_2$ surface is pristine and has a reactive surface. For example, for a PVD deposited $SiO_2$ cap layer, the binding reaction has, a much lower activation energy, as is illustrated in FIG. 8, than on a glass that has a complicated surface chemistry, has an environmental contaminant on it or, has a water layer on the glass surface.

Thus, once the ETC coating has been applied over the optical coating, the glass substrate with the optical coating and the ETC coating is removed from the chamber and allowed to cure in air. If allowed to cure simply by sitting at room temperature. (approximately 18-25° C., Relative Humidity (RH) 40%) the curing will take 1-3 days. Elevated temperatures may be utilized to expedite curing. For example, in one embodiment, the ETC coated article may be heated to a temperature of 80-100° C. for a time period from about 10 minutes to about 30 minutes at a RH in the range of greater than 50% and less than 100%. Typically the relative humidity is in the range of 50-85%.

Once the ETC coating has been cured, the surface of the coating is wiped with a soft brush or an isopropyl alcohol wipe to remove any ETC material that has not bonded to the optical coating.

The methods and apparatuses described herein may be used to produced coated glass articles 300, such as coated glass substrates 310, which have both an optical coating 320 (such as an AR coating or a similar optically functional coating) and an ETC coating 330 positioned over the optical coating, as shown in FIG. 20. Utilizing the methods and apparatuses described herein, the coated glass articles 300 are generally shadow free across the optically coated surface of the glass article, as shown in FIG. 20. In embodiments, such as the embodiment shown in FIG. 20, the optical coating 320 applied to the glass article may have a plurality of periods 340 consisting of a layer of high refractive index material H 350 having an index of refraction n greater than or equal to 1.7 and less than or equal to 3.0, and a layer of low refractive index material L 360 having an index of refraction n greater than or equal to 1.3 and less than or equal to 1.6. The layer of high refractive index material H 350 may be the first layer of each period and the layer of low refractive index material L 360 may be the second layer of each period. Alternatively, the layer of low refractive index material may be the first layer of each period and the layer of high refractive index material H may be the second layer of each period. In some embodiments, the number of coating periods in the optical coating may be greater than or equal to 2 and less than or equal to 1000. The optical coating 320 may further include a capping layer of $SiO_2$ 370. The capping layer 370 may be applied on over one or a plurality of periods 340 and may have a thickness in the range greater than or equal to 20 nm and less than or equal to 200 nm. In the embodiments described herein, the optical coating may have a thickness in the range from greater than or equal to 100 nm to less than or equal to 2000 nm. However, greater thicknesses are possible depending on the intended use of the coated article. For example, in some embodiments, the optical coating thickness can be in the range of 100 nm to 2000 nm. In some other embodiments, the optical coating thickness can be in the range of 400 nm to 1200 nm or even in the range from 400 nm to 1500 nm.

The thickness of each of the layers of high refractive index material and low refractive index material may be in a range from greater than or equal to 5 nm and less than or equal to 200 nm. The thickness of each of the layers of high refractive index material and low refractive index material may be in a range from greater than or equal to 5 nm and less than or equal to 100 nm. As will be described further herein, the coated glass articles exhibit an improved resistance to abrasion due to the specific coating methods and techniques utilized herein. The degradation of the coatings applied to the glass article may be assessed by the water contact angle following exposure of the glass coating to abrasion testing. The abrasion testing was carried out by rubbing grade 0000# steel wool across the coated surface of the glass substrate under a 10 kg normal load. The abraded area is 10 mm×10 mm. The frequency of abrasion is 60 Hz and the travel distance of the steel wool is 50 mm. The abrasion testing is performed at a relative humidity RH<40%. In the embodiments described herein, glass articles have a water contact angle of at least 75° after 6,000 abrasion cycles. In some embodiments, the glass articles have a water contact angle of at least 105° after 6,000 abrasion cycles. In still other embodiments, the glass articles have a water contact angle of greater than 90° after 10,600 abrasion cycles.

The resistance of the glass article to abrasion and degradation may also be assessed by the length of scratches present on the glass article following abrasion testing. In embodiments described herein, the coated glass articles have a surface scratch length of less than 2 mm following 8000 abrasion cycles.

Moreover, the resistance of the glass article to abrasion and degradation may also be assessed by the change in the reflectance and/or transmittance of the glass article following abrasion testing, as will be described in more detail herein. In some embodiments, a % Reflectance of the glass article after at least 8,000 abrasion/wiping cycles is substantially the same as the % Reflectance of an unabraded/unwiped glass article. In some embodiments, the % Transmission of the glass article after at least 8,000 abrasion/wiping cycles is substantially the same as the % Transmission of an unabraded/unwiped glass article.

The deposition methods described herein may be used to produce a shadow free optical coating. This means that mean that the optical coating is uniformly deposited over the entire coated surface of the glass substrate. In embodiments of the coated glass substrates described herein, the variation in a thickness of the optical coating from a first edge of the optical coating to second edge of the optical coating of the glass substrate is less than 4%. For example, in some embodiments, the variation the thickness of the optical coating from a first edge of the optical coating to second edge of the optical coating of the glass substrate is less than or equal to 3%. In some other embodiments the variation in the thickness of the optical coating from a first edge of the optical coating to second edge of the optical coating of the glass substrate is less than or equal to 2%. In still other embodiments, the variation in the thickness of the optical coating from a first edge of the optical coating to second edge of the optical coating of the glass substrate is less than or equal to 1%.

Ion-assisted electron-beam deposition provides a unique advantage for coating small and medium size glass substrates, for example those having facial dimensions in the range of approximately 40 mm×60 mm to approximately 180 mm×320 mm, depending on chamber size. Ion assisted coating process provides a freshly deposited optical coating on the glass surface that has low surface activation energy with regard to the subsequent application of the ETC coating since there is no surface contamination (water or other environmental) that might impact ETC coating performance and reliability. The application of the ETC coating directly after completion of the optical coating improves crosslinking between two fluorocarbon functional groups, improves wear resistance, and improves contact angle performance (higher oleophobic and hydrophobic contact angles) following thousands of abrasion cycles applied to the coating. In addition, ion-assisted e-beam coating greatly reduces coating cycle time to enhance coater utilization and throughput. Further, no post deposition heat treatment or UV curing of the ETC coating is required due to lower activation energy of the optical coating surface which makes the process compatible with post ETC processes in which heating is not permitted. Using the Ion-assisted e-beam PVD processes described herein, the ETC material can be coated on selected regions to avoid contamination to other locations of substrate.

Example 1

A 4-layer $SiO_2/Nb_2O_5/SiO_2/Nb_2O_5$/substrate AR optical coating was deposited on sixty (60) pieces of Gorilla™ Glass (commercially available from Corning Incorporated) with dimension (Length, Width, Thickness) of approximately 115 mm L×60 mm W×0.7 mm T. The coating was deposited using the methods described herein. The AR coating had a thickness of approximately 600 nm. After deposition of the AR coating an ETC coating was applied on top of the AR coating by thermal evaporation using perfluoroalkyl trichlorosilanes having a carbon chain length in the range of 5 nm to 20 nm (Optool™ fluoro coating, Daikin Industries was used as an exemplary species). The deposition of the AR and ETC coating was carried out in a single chamber coating apparatus as illustrated in FIG. 1A. After the AR coating was deposited the AR coating source material was shut off and the ETC material was thermally evaporated and deposited on the AR coated glass. The coating process was 73 minutes including parts loading/unloading. Subsequently, after the ETC coating was cured, water contact angles were determined after the surface was abraded using various abrasion cycles as indicated in Table 1. The abrasion testing was conducted with #0 steel wool and a 1 kg weight load. The data in Table 1 indicates that the sample has very good wear and hydrophobic properties. The coating order and layer thickness for a 6-layer $Nb_2O_5$/$SiO_2$ coating on a glass substrate is given in Table 2.

TABLE 1

Water contact angle abrasion test results

| Sample | Before Abrasion | | | 3.5K Abrasion | | | 4.5K Abrasion | | | 5.5K Abrasion | | |
|---|---|---|---|---|---|---|---|---|---|---|---|---|
| 1 | 113.8 | 114.2 | 116.1 | 109.9 | 107.2 | 108.5 | 92.6 | 103.4 | 96.3 | 69.5 | 85.5 | 70.5 |

TABLE 2

| Layer Number | Material | Thickness Range, nm |
|---|---|---|
| 6 | $SiO_2$ | 80-120 |
| 5 | $Nb_2O_5$ | 75-90 |
| 4 | $SiO_2$ | 5-20 |
| 3 | $Nb_2O_5$ | 40-80 |
| 2 | $SiO_2$ | 24-40 |
| 1 | $Nb_2O_5$ | 10-20 |
| Substrate | Glass | NA |

Example 2

Figure 9:
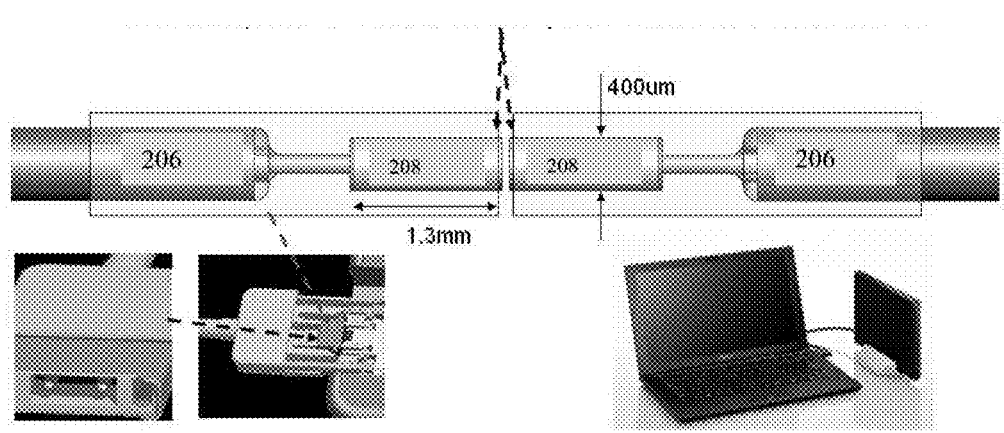
FIG. 9 is an illustration of AR-ETC coated GRIN lenses 208 for use with optical fibers 206 and some of their uses.

In this Example the same fluoro-coating used in Example 1 was coated on a GRIN-lens for optical connectors, as is illustrated in FIG. 9, for use on optical fibers 206 used in laptop computers. Numeral 200 and arrow point to of a selective region of the GRIN lenses 208 for placing an ETC coating on top of an 850 nm AR coating to provide particle and wear resistance. Numeral 202 illustrates connecting an optical fiber to a laptop or tablet device, and numeral 204 illustrates the use of a coated fiber optic to connect a laptop to a media dock.

Figure 10:
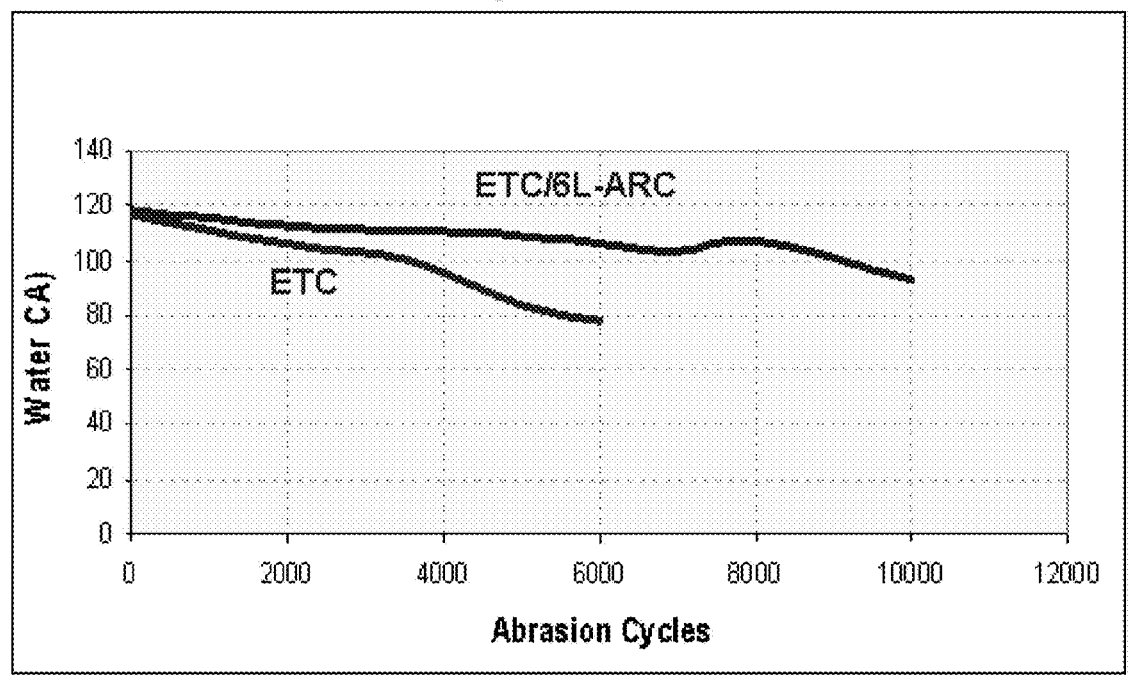
FIG. 10 is a comparison of abrasion testing data for a glass article having a PVD 8-10 nm ETC on 6 layer ARC (Nb2O5/SiO2) coating and a glass article having only a spray coated ETC coating.

FIG. 10 is abrasion testing data on a glass article having an 8-10 nm thermally deposited on a ETC coating on a 6 layer AR coating consisting of substrate/(Nb2O5/SiO2)3, ETC/6L-AR coating, versus a glass sample with only the spray coated ETC coating. The glass was 0.7 mm thick Corning code 2319 glass which is commercially available, chemically tempered (ion-exchanged) glass. The abrasion testing was carried out under following conditions: grade 0000# steel wool, 10 kg load on 10 mm×10 mm area, 60 Hz, 50 mm travel distance, RH<40%. A water contact angle greater than 75 degrees is the criterion for judging coating failure. It was found that glass having an AR coating without the ETC coating was scratch damaged after only 10-20 wiping cycles. FIG. 10 shows that both glass samples start out with a water contact angle of 120°, and, after 6000 abrasion cycles the glass sample with only the ETC coating had a water contact angle of 80° whereas the glass sample made as described herein, ETC/6 layer-AR coating, had a water contact angle of at least 105°. After 10,000 abrasion cycles the water contact angle of the ETC/6 layer-AR coating coated article was greater than 90°. The test clearly indicates that a glass article having an ETC coating deposited on top of an AR coating has a much greater degree of scratch resistance than a glass article have only an ETC coating applied to the glass.

Figure 11:
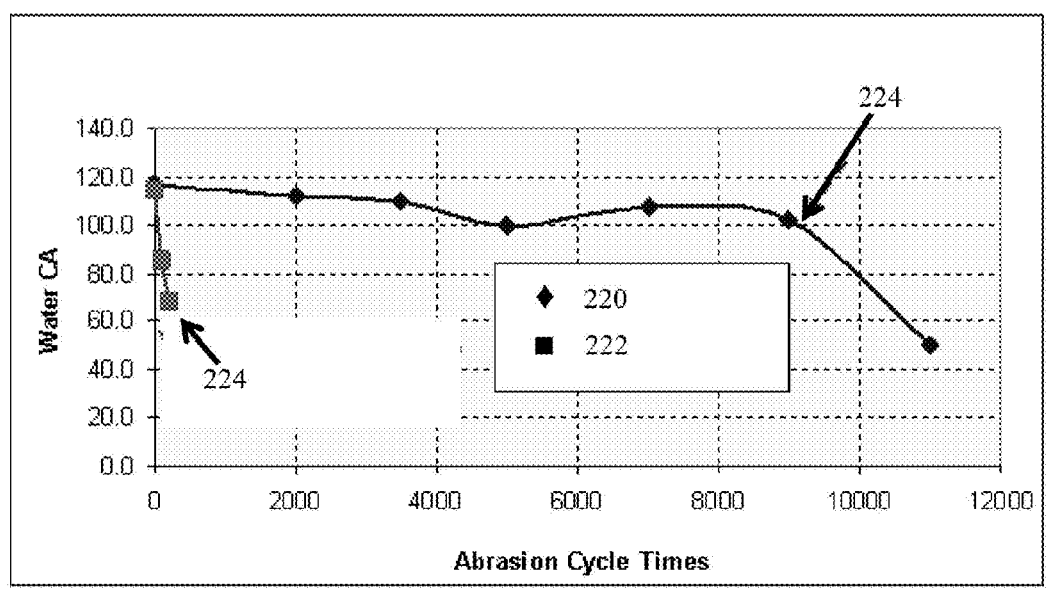
FIG. 11 is a comparison of the abrasion reliability of a glass article having a 6 layer PVD IAD-EB AR coating and an 8-10 nm thermal deposited ETC coating on top of the AR coating relative to a glass article having PVD AR coating deposited in a first conventional coater and an ETC deposited in a second conventional coater.

FIG. 11 is a comparison of the abrasion durability of a (1) a glass article with a 6 layer PVD IAD-EB AR coating and an 8-10 nm thermally deposited ETC coating on top of the AR coating (indicated by numeral 220 and the diamond data marker), versus a commercially available glass article (indicated by numeral 222 and the square data marker) having a PVD-AR coating deposited by a first commercial coater apparatus and an ETC deposited in a second chamber by a commercial process such as dipping or spraying. Both coatings were deposited on samples of the same chemically tempered (ion-exchanged) 0.7 mm thick Corning Code 2319 glass. Glass article 220 was coated according to the methods described herein. The commercially available glass article was coated by a commercial coating vendor. The abrasion durability was carried out at a relative humidity of 40%. At the point indicated by arrow 224, only short, shallow scratches, less than 2 mm long, appeared after 8,000 cycles. In contrast, at the point indicated by arrow 226 deep, long scratches, greater than 5 mm long, appeared after only 200 wipes. The test results indicate that the abrasion durability of AR coating-ETC glasses coated as described herein is at least 10 times greater than the durability of commercially available products.

Figure 17B:
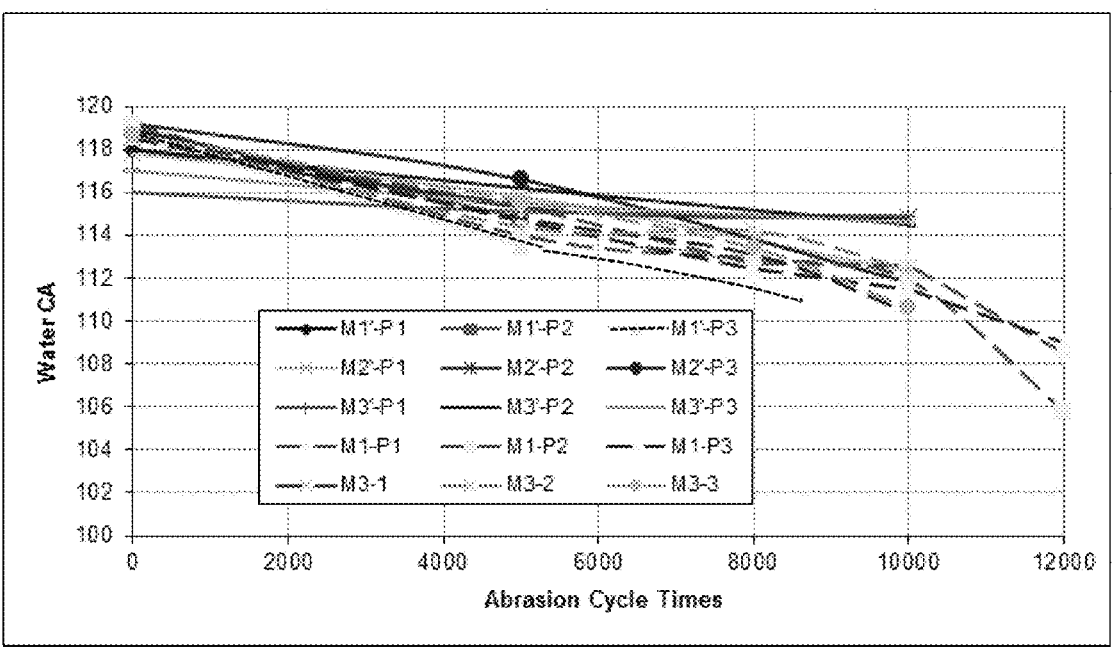
FIG. 17B is a graph of the Water Contact Angle versus Abrasion Cycles illustrating the improvement that is obtained using the mask as illustrated in FIG. 17A.

FIG. 17B graphically depicts the Water Contact Angle versus Abrasion Cycles illustrating the improvement that is obtained using a coating apparatus configured as depicted in FIG. 17A. The water contact angle results can be compared to those of FIGS. 10 and 11. The data in FIG. 17B show that, after 10,000 abrasion cycles, all the substrates illustrated in FIG. 17B have a water contact angle of greater than 110°, and substantially all of the substrates had a water contact angle of 112° or higher. In contrast, the data of FIGS. 10 and 11 indicate that the water contact angles were less than 100° after 10,000 abrasion cycles. Further, the data in FIG. 17B indicates that for substrates that have been subjected to 12,000 abrasion cycles, the water contact angles of the substrates is greater than 106°.

Figure 12:
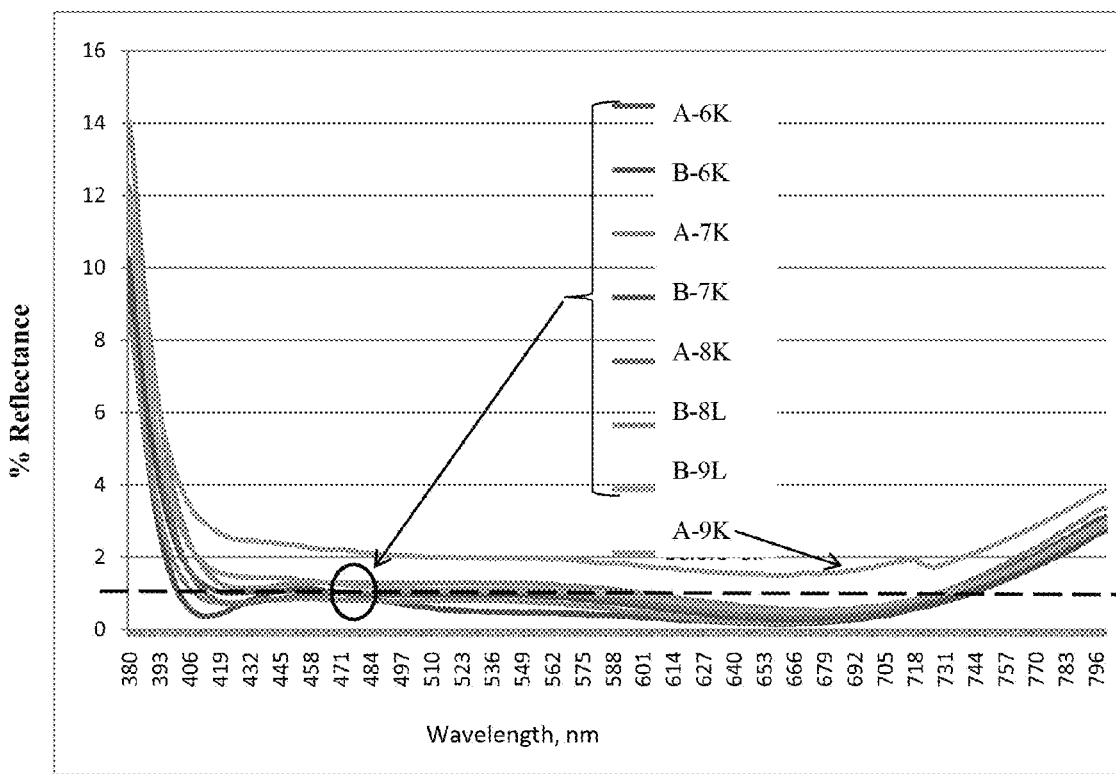
FIG. 12 is a graph of % Reflectance versus wavelength for glass articles coated with an AR coating and an ETC coating after 6K, 7K, 8K and 9K wipes.

FIG. 12 is a graph of % Reflectance versus wavelength, where Reflectance means the percentage of light reflected from the surface of the coated glass article coated with an AR coating and ETC coating as described herein. A new (unabraded or unwiped) article was used for each wiping test. The abrasion/wiping was carried out under following conditions: grade 0000# steel wool, 10 kg load on 10 mm×10 mm area, 60 Hz, 50 mm travel distance, RH<40%. Reflectance was measured after 6K, 7K, 8K and 9K abrasions. The graph indicates that new articles and articles wiped up to 8K wipes have substantially the same reflectance. After 8K wipes the reflectance increases. This reflection increase is believed due to slight abrasion of the glass surface as a result of a large number of wipes. In the graph the letter "A" means "After Wiping" and the letter "B" means "Before Wiping" (zero wipes). The letter "K" means "kilo" or "thousand".

Figure 13:
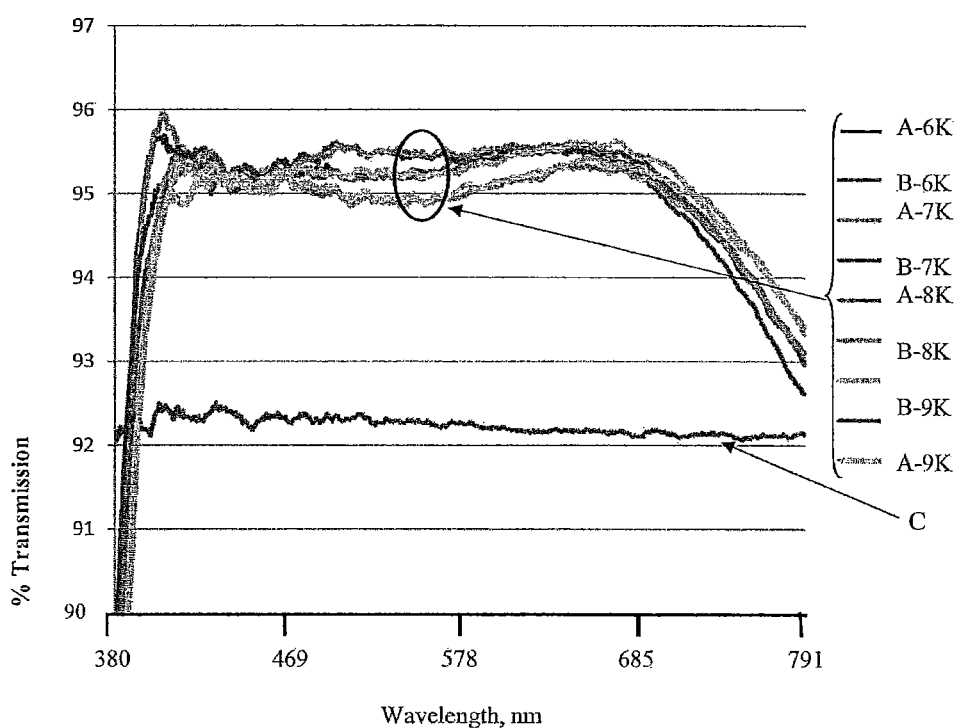
FIG. 13 is a graph of % Transmission versus wavelength for glass articles with an AR coating and an ETC coating after 6K, 7K, 8K and 9K wipes.

FIG. 13 is a graph of % Transmission versus wavelength. The testing was performed on coated glass articles coated with an AR coating and ETC coating as described herein. A new (unabraded or unwiped) article was used for each wiping test. The transmission test used the same articles as the reflectance test. The graph indicates that new articles and articles wiped up to 8K wipes have substantially similar transmissions, the transmission being the range of 95-96%. After 8K wipes the transmission falls to approximate 92% over the entire wavelength range, as indicated by letter "C" in the graph of FIG. 13. This transmission decrease is believed due to slight abrasion of the glass surface as a result of a large number of wipes. In the graph the letter "A" means "After wiping" and the letter "B" means "Before wiping" (zero wipes). The letter "K" means "kilo" or "thousand".

The data in FIGS. 12 and 13 indicate that the optical coating on the glass articles is highly durable in addition to having excellent water contact angle retention as is shown by FIGS. 10 and 11.

FIG. 14 is a graph of Reflectance % versus wavelength illustrating the effect of the numbers of AR coating layers/periods on reflectance relative to glass without an AR coating. Curve 240 represents uncoated ion-exchanged glass, Corning Code 2319. Curve 244 is a 2-layer, or 1-period, coating consisting of $SiO_2/Nb_2O_3$. Curves 246 and 248 are 4-layer (2 periods) and 6-layer (3 periods) coatings consisting of $SiO_2/Nb_2O_3$ layer pairs. Curve 242 is a 1-layer coating of $Nb_2O_3$. The data indicates that increasing the AR coating stack number (layers/periods) will broaden the utility of the AR coating spectral range and will also decrease the Reflectance %.

Example 3

Figure 18:
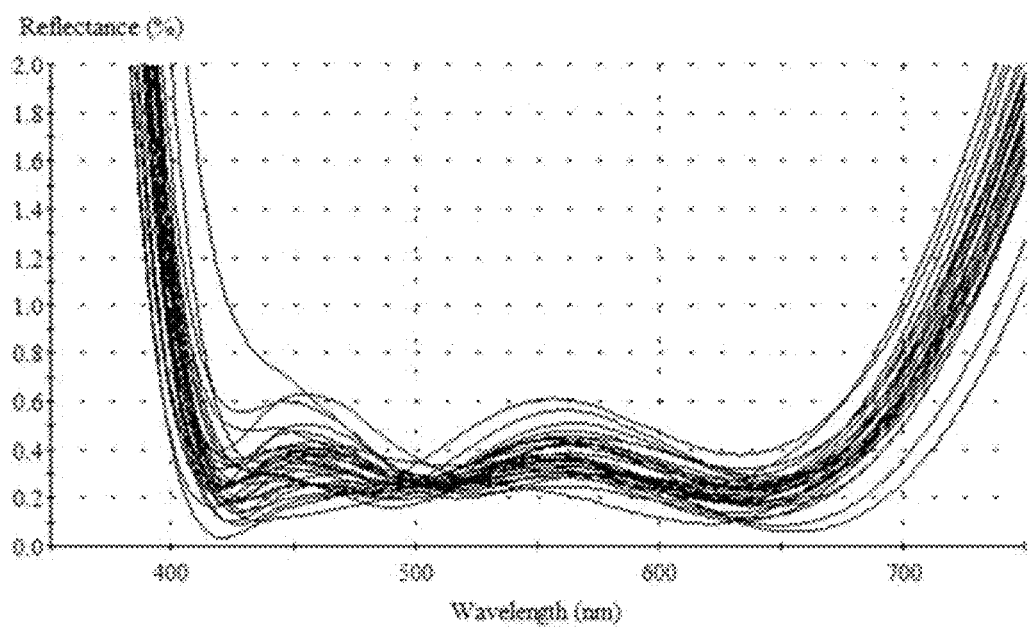
FIG. 18 is a simulation of the reflectance (y-axis) as a function of wavelength (x-axis) for a glass substrate coated with a 6 layer AR coating ($Nb_2O_5/SiO_2$) and an ETC coating with the AR coating having a thickness variation of 2%.
Figure 19:
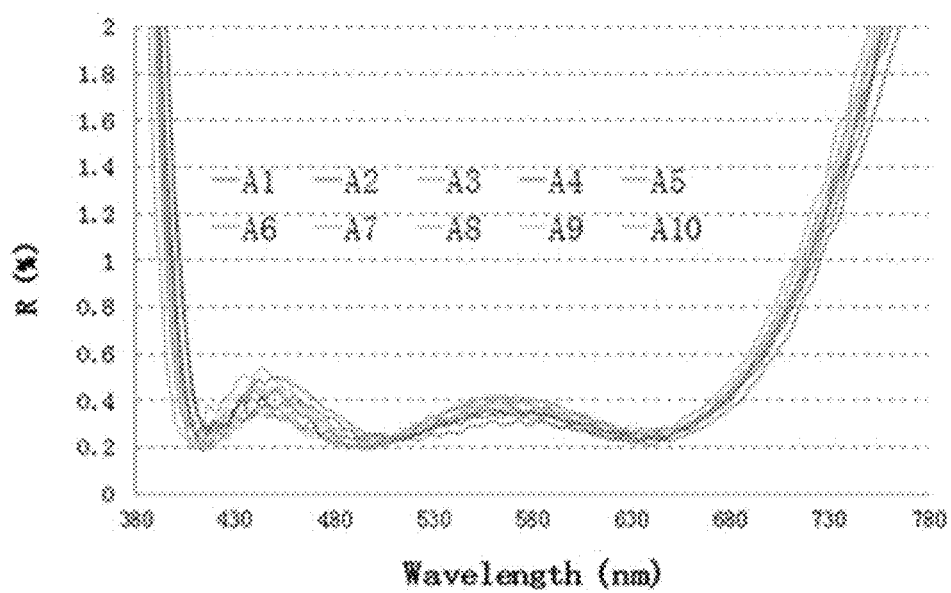
FIG. 19 graphically depicts the reflectance (y-axis) as a function of wavelength for a plurality of actual samples coated with a 6 layer AR coating ($Nb_2O_5/SiO_2$) and an ETC coating.

FIG. 18 is a computer simulation of the reflectance (y-axis) as a function of wavelength (x-axis) for a glass substrates coated with a 6 layer AR coating ($Nb_2O_5/SiO_2$) and an ETC coating. The AR coating was simulated with a thickness variation of 2%. Accordingly, the resultant reflectance profile simulates the reflectance of a 6 layer AR coating ($Nb_2O_5/SiO_2$) and an ETC coating where the ETC coating has a thickness variation of 2%. FIG. 19 graphically depicts the reflectance (y-axis) as a function of wavelength for a plurality of actual samples coated with a 6 layer AR coating ($Nb_2O_5/SiO_2$) and an ETC coating using the methods and apparatuses described herein. As depicted in FIG. 19, the reflectance profile of the actual samples is similar to the reflectance profile of the simulated samples, thus indicating that the samples coated using the methods described have an optical coating in which the thickness variation of the optical coating across the coated substrate (i.e., from the first edge to second edge of the optical coating) is less than 3%.

The AR/ETC coating described herein can be utilized in many commercial articles. For example, the resulting coating can be used to make televisions, cell phones, electronic tablets, and book readers and other devices readable in sunlight. The AR/EC coatings also have utility in antireflection beamsplitters, prisms, mirrors and laser products; optical fibers and components for telecommunication; optical coatings for use in biological and medical applications; and for anti-microbial surfaces.

In a first aspect, the disclosure provides a method for making a glass article having an optical coating and an easy-to-clean (ETC) coating on top of the optical coating. The method includes: providing a coating apparatus having a vacuum chamber for deposition of an optical coating and an ETC coating; providing a magnetic rotatable dome within said vacuum chamber for magnetically positioning a magnetic substrate carrier for receiving a glass substrate thereon that is to be coated; providing within said vacuum chamber source materials for the optical coating and source materials for the ETC coating; loading the glass substrate on the magnetic substrate carrier and magnetically attaching the magnetic substrate carrier having the glass substrate thereon to the magnetic rotatable dome; evacuating the vacuum chamber; rotating the magnetic rotatable dome and depositing an optical coating on the glass substrate; rotating the magnetic rotatable dome and depositing the ETC coating on top of the optical coating following deposition of the optical coating, wherein the optical coating is not exposed to ambient atmosphere prior to the deposition of the ETC coating; and removing the glass substrate having the optical coating and the ETC coating from the vacuum chamber to obtain a glass substrate having a shadow-free optical coating deposited on the glass substrate and the ETC coating deposited on the optical coating.

In a second aspect, the disclosure provides the method of the first aspect further comprising curing the ETC coating.

In a third aspect, the disclosure provides the method according to either of the first or second aspects wherein the ETC coating is cured in air at room temperature.

In a fourth aspect, the disclosure provides the method according to either of the first or second aspects, wherein the ETC coating is cured by heating the ETC coating.

In a fifth aspect, the disclosure provides the method according to any of the first through fourth aspects, wherein the vacuum chamber is evacuated to a pressure of less than or equal to $10^{-4}$ Torr.

In a sixth aspect, the disclosure provides the method according to any of the first through fifth aspects, wherein the method further comprises densifying the optical coating as the optical coating is deposited.

In a seventh aspect, the disclosure provides the method according to any of the first through sixth aspects, wherein the vacuum chamber contains at least one e-beam source for vaporizing the source materials for the optical coating.

In an eighth aspect, the disclosure provides the method according to the seventh aspect, wherein the at least one e-beam source comprises greater than or equal to 2 and less than or equal to 6 e-beam sources and an e-beam from each source is directed to a separate container holding a material being coated.

In a ninth aspect, the disclosure provides the method according to any of the first through eighth aspects, wherein the magnetic substrate carrier is selected from the group consisting of a fixed magnetic substrate carrier and an adjustable magnetic substrate carrier.

In a tenth aspect, the disclosure provides the method according to any of the first through ninth aspects, wherein depositing the optical coating comprises depositing a multilayer optical coating comprising at least one period of a high refractive index material and a low refractive index material, wherein: the high refractive index material is selected from the group consisting of $ZrO_2$, $HfO_2$, $Ta_2O_5$, $Nb_2O_5$, $TiO_2$, $Y_2O_3$, $Si_3N_4$, $SrTiO_3$, $WO_3$; and the low refractive index material is selected from the group consisting of $SiO_2$, $MgF_2$, $YF_3$, $YbF_3$ and $Al_2O_3$.

In an eleventh aspect, the disclosure provides the method according to any of the first through tenth aspects, wherein the glass substrate is formed from ion-exchanged silica glass, non-ion-exchanged silica glass, aluminosilicate glass, borosilicate glass, aluminoborosilicate glass, or soda lime glass.

In a twelfth aspect, the disclosure provides the method according to any of the first through eleventh aspects, wherein the source material for the ETC coating is a alkyl perfluorocarbon silane of formula $(R_F)_x SiX_{4-x}$, where $R_F$ is a linear $C_6$-$C_{30}$ alkyl perfluorocarbon, X=Cl or —OCH$_3$— and x=2 or 3.

In a thirteenth aspect, the disclosure provides a magnetic substrate carrier for holding a substrate during a coating process. The magnetic substrate carrier comprises a non-magnetic substrate carrier base; a plurality of magnets attached to the non-magnetic substrate carrier base; a plurality of pins for supporting a surface of a glass substrate positioned on the magnetic substrate carrier; a spring system comprising a retractable pin held in place by a spring that retracts the retractable pin, the retractable pin being extendable in a direction opposite the spring, a plurality of fixed pins, and a plurality of side stoppers extending from the non-magnetic substrate carrier base for a distance such that, when the glass substrate is positioned on the plurality of pins, tops of the plurality of side stoppers are below a top surface of the glass substrate.

In a fourteenth aspect, the disclosure provides a magnetic substrate carrier for holding substrates during a coating process. The magnetic substrate carrier comprises: a non-magnetic carrier base; a plurality of magnets attached to the non-magnetic carrier base; a plurality of pins for supporting a surface of a glass substrate; a housing with a retractable pin disposed in the housing, wherein the retractable pin is held in place by a spring, the retractable pin being outwardly biased from the housing; optional stoppers; and a plurality of movable pins for holding an edge of a glass substrate.

In a fifteenth aspect, the disclosure provides a glass article comprising an optical coating and an easy-to-clean coating on top of the optical coating, the glass article being shadow free across an optically coated surface of the glass article, wherein: the optical coating comprises a plurality of periods consisting of a layer of high refractive index material H having an index of refraction n greater than or equal to 1.7 and less than or equal to 3.0, and a layer of low refractive index material L having an index of refraction n greater than or equal to 1.3 and less than or equal to 1.6, the layer of high refractive index material H being a first layer of each period and the layer of low refractive index material L being a second layer of each period; and an SiO$_2$ capping layer having a thickness in a range greater than or equal to 20 nm and less than or equal to 200 nm applied on top of the plurality of periods.

In a sixteenth aspect, the disclosure provides the glass article of the fifteenth aspect, wherein a number of coating periods is in a range from greater than or equal to 2 and less than or equal to 1000.

In a seventeenth aspect, the disclosure provides the glass article of any of the fifteenth through sixteenth aspects, wherein the optical coating has a thickness in a range from greater than or equal to 100 nm to less than or equal to 2000 nm.

In an eighteenth aspect, the disclosure provides the glass article of any of the fifteenth through seventeenth aspects, wherein a number of coating periods is in a range from greater than or equal to 2 and less than or equal to 20, and a thickness of each layer of high refractive index material H and low refractive index material L is in a range from greater than or equal to 5 nm and less than or equal to 200 nm.

In a nineteenth aspect, the disclosure provides the glass article of any of the fifteenth through seventeenth aspects, wherein a number of coating periods is in a range from greater than or equal to 2 and less than or equal to 20, and a thickness of each layer of high refractive index material H and the low refractive index material L is in a range from greater than or equal to 5 nm and less than or equal to 100 nm.

In a twentieth aspect, the disclosure provides the glass article of any of the fifteenth through nineteenth aspects, wherein the layer of high refractive index material H is selected from the group consisting of $ZrO_2$, $HfO_2$, $Ta_2O_5$, $Nb_2O_5$, $TiO_2$, $Y_2O_3$, $Si_3N_4$, $SrTiO_3$ and $WO_3$.

In a twenty-first aspect, the disclosure provides the glass article of any of the fifteenth through twentieth aspects, wherein the low refractive index material is selected from the group consisting of $SiO_2$, $MgF_2$, $YF_3$, $YbF_3$, and $Al_2O_3$.

In a twenty-second aspect, the disclosure provides the glass article of any of the fifteenth through twenty-first aspects, wherein the glass article has a water contact angle of at least 75° after 6,000 abrasion cycles.

In a twenty-third aspect, the disclosure provides the glass article of any of the fifteenth through twenty-second aspects, wherein the glass article has a water contact angle of at least 105° after 6,000 abrasion cycles.

In a twenty-fourth aspect, the disclosure provides the glass article of any of the fifteenth through twenty-third aspects, wherein the glass article has a water contact angle of greater than 90° after 10,600 abrasion cycles.

In a twenty-fifth aspect, the disclosure provides the glass article of any of the fifteenth through twenty-fourth aspects, wherein after 8,000 abrasion cycles, scratches on a surface of the glass article are less than 2 mm in length.

In a twenty-sixth aspect, the disclosure provides the glass article of any of the fifteenth through twenty-fifth aspects, wherein a % Reflectance of the glass article after at least 8,000 abrasion/wiping cycles is substantially the same as the % Reflectance of an unabraded/unwiped glass article.

In a twenty-seventh aspect, the disclosure provides the glass article of any of the fifteenth through twenty-sixth aspects, wherein a % Transmission of the glass article after at least 8,000 abrasion/wiping cycles is substantially the same as the % Transmission of an unabraded/unwiped glass article.

In a twenty-eighth aspect, the disclosure provides a coating apparatus for coating a substrate with an optical coating and an ETC coating. The coating apparatus comprises: a vacuum chamber; a magnetic rotatable dome positioned in the vacuum chamber; at least one e-beam source positioned in the vacuum chamber; at least one thermal evaporation source positioned in the vacuum chamber; and a shadow mask adjustably positioned on a support within the vacuum chamber.

In a twenty-ninth aspect, the disclosure provides the coating apparatus of the twenty-eighth aspect, wherein the coating apparatus further comprises a plasma source positioned in the vacuum chamber.

In a thirtieth aspect, the disclosure provides the coating apparatus of any of the twenty-eighth through twenty-ninth aspects, wherein the rotatable magnetic dome comprises: an opening at a top center of the magnetic rotatable dome; a transparent glass plate covering the opening of the magnetic rotatable dome; and a quartz monitor positioned in an opening in the transparent glass plate for monitoring a deposition rate of coating material deposited in the vacuum chamber.

In a thirty-first aspect, the disclosure provides the coating apparatus the thirtieth aspect, wherein the coating apparatus further comprises an optical fiber positioned above the transparent glass plate, wherein the optical fiber collects light reflected from the transparent glass plate as the transparent glass plate is coated to determine a change in reflectance of the transparent glass plate and thereby a thickness of coatings applied to the transparent glass plate.

In a thirty-second aspect, the disclosure provides the coating apparatus of any of the twenty-eighth through thirty-first aspects, wherein the magnetic rotatable dome is attached to a vacuum shielded rotation shaft to facilitate rotation of the magnetic rotatable dome.

In a thirty-third aspect, the disclosure provides the coating apparatus of any of the twenty-eighth through thirty-second aspects, wherein the coating apparatus further comprises at least one magnetic substrate carrier magnetically attached to the magnetic rotatable dome.

In a thirty-fourth aspect, the disclosure provides a process for making glass articles having an optical coating in the glass articles and an easy-to-clean, ETC, coating on top of the optical coating, the process comprising: providing a coating apparatus having at chamber for the deposition of an optical coating and ETC coating; providing a rotatable dome within said chamber for magnetically positioning a substrate carrier having an glass substrate thereon that is to be coated, said dome being concave and having a an opening at the top for the placement of quartz and optical fiber measuring elements; providing within said chamber source materials for the optical coating and source materials for the ETC coating, wherein when a plurality of source materials are required for making the optical coating, each of the plurality of materials is provided in a separate source container; providing a glass substrate, loading the glass substrate on the substrate carrier and magnetically attaching the substrate carrier having the glass substrate thereon to the dome; evacuating the chamber to a pressure of $10^{-4}$ Torr or less; rotating the dome and depositing an optical coating on the glass substrate; ceasing the deposition of the optical coating following the deposition of the optical coating, rotating the dome and depositing the ETC coating on top of the optical coating; ceasing the deposition of the ETC coating; and removing the substrate having an optical coating and an ETC coating from the chamber to obtain a glass substrate having an optical coating deposited on the substrate and an ETC coating deposited on the optical coating.

In a thirty-fifth aspect, the disclosure provides the method of the thirty-fifth aspect wherein the optical coating is a multilayer coating consisting of alternating layers of a high refractive index metal oxide and a low refractive index metal oxide, and each high/low index pair of layers is deemed to be a coating period. The number of periods is in the range of 2-1000. The multilayer coating has a thickness in the range of 100 nm to 2000 nm. The ETC materials is an alkyl perfluorocarbon silane of formula $(R_F)_xSiX_{4-x}$, where $R_f$ is a linear $C_6$-$C_{30}$ alkyl perfluorocarbon, X=Cl or —OCH$_3$— and x=2 or 3. The alkyl perfluorocarbon have a carbon chain length in the range of 3 nm to 50 nm. Perfluorinated ethers attached to the above $SiX_{4-x}$ moiety can also be used as ETC coating materials.

In a thirty-sixth aspect, the disclosure provides the method of the thirty-third through thirty-fifth aspects the optical coating and the ETC coating are deposited in a chamber, and the optical coating is densified during deposition using an ion beam or a plasma. In a further embodiment, when the optical coating is an oxide coating, oxygen or oxygen ions are present in the chamber to insure that the stoichiometry of the metal oxide(s) being coated is maintained.

In a thirty-seventh aspect the disclosure is also directed to an apparatus for making a "shadowless" or "shadow free" glass article having an optical coating and an ETC coating thereon, the apparatus comprising a vacuum chamber having therein a source of the optical coating materials and a source of the ETC coating material, a rotatable dome having a plurality of substrate carriers for holding substrates, the substrate carried being magnetically attached to the rotatable dome.

In a thirty-eighth aspect, the disclosure provides a glass article having an optical coating on the surface of the a glass substrate and easy-to-clean coating on top of the optical coating, said glass article being shadow free across the optically coated surface of the glass; wherein the optical coating is a plurality of periods consisting of a layer of a high refractive index material H, n=1.7-3.0, and a low refractive index material L, n=1.3-1.61, the H layer being the first layer of each period and the L layer being the second layer of each period; and when the last L layer of the optical coating is not $SiO_2$, a $SiO_2$ capping layer having a thickness in the range of 20-200 nm is applied on top of the plurality of periods. When the last period of the optical coating is $SiO_2$ and additional SiO layer having a thickness in the range of 20-200 nm can optionally be deposited as a capping layer. In one embodiment the number of optical coating periods is in the range of 2-1000. In another embodiment the thickness of the optical coating thickness in the range of 100 nm to 2000 nm. The number of optical coating periods is in the range 2-20, and the thickness of each of the high refractive index materials and the low refractive index materials is in the range of 5-200 nm. In another embodiment the number of optical coating periods is in the range 2-20, and the thickness of each of the high refractive index material and the low refractive index materials is in the range of 5-100 nm. The high index coating material is selected from the group consisting of $ZrO_2$, $HfO_2$, $Ta_2O_5$, $Nb_2O_5$, $TiO_2$, $Y_2O_3$, $Si_3N_4$, $SrTiO_3$ and $WO_3$. The low index coating material is selected from the group consisting of $SiO_2$, $MgF_2$, $YF_3$ and $YbF_3$. In an embodiment $Al_2O_3$, n–1.5-1.7. is used in place of the low refractive index material and a capping layer of $SiO_2$ is applied as the final layer.

In a thirty-ninth aspect, the disclosure provides the method of any of the first through twelfth aspects and the glass article of any of the fifteenth through twenty-seventh aspects, wherein a variation in a thickness of the optical coating from a first edge of the optical coating to second edge of the optical coating of the glass substrate or the glass article is less than or equal to 3%.

In a fortieth aspect, the disclosure provides the method of any of the first through twelfth aspects and the glass article of any of the fifteenth through twenty-seventh aspects, wherein a variation in a thickness of the optical coating from a first edge of the optical coating to second edge of the optical coating of the glass article is less than or equal to 2%.

In a forty-first aspect, the disclosure provides the method of any of the first through twelfth aspects and the glass article of any of the fifteenth through twenty-seventh aspects, wherein a variation in a thickness of the optical coating from a first edge of the optical coating to second edge of the optical coating of the glass substrate or the glass article is less than or equal to 1%.

It will be apparent to those skilled in the art that various modifications and variations can be made to the embodiments described herein without departing from the spirit and scope of the claimed subject matter. Thus it is intended that the specification cover the modifications and variations of the various embodiments described herein provided such modification and variations come within the scope of the appended claims and their equivalents.

We claim:

1. A glass article comprising a vacuum-deposited optical coating and a vacuum-deposited easy-to-clean coating on top of the optical coating, the glass article being shadow free across an optically coated surface of the glass article, wherein:

the optical coating comprises a plurality of periods consisting of a layer of high refractive index material H having an index of refraction n greater than or equal to 1.7 and less than or equal to 3.0, and a layer of low refractive index material L having an index of refraction n greater than or equal to 1.3 and less than or equal to 1.6, the layer of high refractive index material H being a first layer of each period and the layer of low refractive index material L being a second layer of each period; and an $SiO_2$ capping layer having a thickness in a range greater than or equal to 20 nm and less than or equal to 200 nm applied on top of the plurality of periods.

2. The glass article according to claim 1, wherein a number of coating periods is in a range from greater than or equal to 2 and less than or equal to 1000.

3. The glass article according to claim 1, wherein the optical coating has a thickness in a range from greater than or equal to 100 nm to less than or equal to 2000 nm.

4. The glass article according to claim 1, wherein a number of coating periods is in a range from greater than or equal to 2 and less than or equal to 20, and a thickness of each layer of high refractive index material H and low refractive index material L is in a range from greater than or equal to 5 nm and less than or equal to 200 nm.

5. The glass article according to claim 1, wherein the layer of high refractive index material H is selected from the group consisting of $ZrO_2$, $HfO_2$, $Ta_2O_5$, $Nb_2O_5$, $TiO_2$, $Y_2O_3$, $Si_3N_4$, $SrTiO_3$ and $WO_3$.

6. The glass article according to claim 1, wherein the layer of low refractive index material L is selected from the group consisting of $SiO_2$, $MgF_2$, $YF_3$, $YbF_3$, and $Al_2O_3$.

7. The glass article according to claim 1, wherein the glass article has a water contact angle of at least 75° after 6,000 abrasion cycles.

8. The glass article according to claim 1, wherein after 8,000 abrasion cycles, scratches on a surface of the glass article are less than 2 mm in length.

9. The glass article according to claim 1, wherein a % Reflectance of the glass article after at least 8,000 abrasion/wiping cycles is substantially the same as the % Reflectance of an unabraded/unwiped glass article.

10. The glass article according to claim 1, wherein a % Transmission of the glass article after at least 8,000 abrasion/wiping cycles is substantially the same as the % Transmission of an unabraded/unwiped glass article.

11. The glass article according to claim 1, wherein a variation in a thickness of the optical coating from a first edge of the optical coating to second edge of the optical coating of the glass article is less than or equal to 3%.

12. The glass article according to claim 1, wherein a variation in a thickness of the optical coating from a first edge of the optical coating to second edge of the optical coating of the article is less than or equal to 2%.

13. The glass article according to claim 1, wherein a variation in a thickness of the optical coating from a first edge of the optical coating to second edge of the optical coating of the glass article is less than or equal to 1%.

* * * * *